United States Patent
Matsushita et al.

(10) Patent No.: US 11,758,814 B2
(45) Date of Patent: Sep. 12, 2023

(54) HEAT-UTILIZING POWER GENERATION BATTERY AND HEAT-UTILIZING POWER GENERATION METHOD USING SAME

(71) Applicants: TOKYO INSTITUTE OF TECHNOLOGY, Tokyo (JP); SANOH INDUSTRIAL CO., LTD., Tokyo (JP)

(72) Inventors: Sachiko Matsushita, Tokyo (JP); Takuma Araki, Tokyo (JP); Biao Mei, Ibaraki (JP); Junya Nishiyama, Ibaraki (JP)

(73) Assignees: TOKYO INSTITUTE OF TECHNOLOGY, Tokyo (JP); SANOH INDUSTRIAL CO., LTD., Tokyo (JP)

( * ) Notice: Subject to any disclaimer, the term of this patent is extended or adjusted under 35 U.S.C. 154(b) by 265 days.

(21) Appl. No.: 17/266,422

(22) PCT Filed: Aug. 6, 2019

(86) PCT No.: PCT/JP2019/030800
§ 371 (c)(1),
(2) Date: Feb. 5, 2021

(87) PCT Pub. No.: WO2020/031992
PCT Pub. Date: Feb. 13, 2020

(65) Prior Publication Data
US 2021/0296552 A1    Sep. 23, 2021

(30) Foreign Application Priority Data

Aug. 6, 2018 (JP) .................................. 2018-147465

(51) Int. Cl.
*H10N 10/856* (2023.01)
*H02N 3/00* (2006.01)

(52) U.S. Cl.
CPC ............. *H10N 10/856* (2023.02); *H02N 3/00* (2013.01)

(58) Field of Classification Search
CPC .................................. H01L 35/24; H02N 3/00
See application file for complete search history.

(56) References Cited

U.S. PATENT DOCUMENTS

| | | | | |
|---|---|---|---|---|
| 2012/0318317 | A1* | 12/2012 | Stafford | ................... H01L 35/24 136/203 |
| 2013/0084464 | A1* | 4/2013 | See | .......................... H01L 35/24 428/626 |
| 2013/0276851 | A1* | 10/2013 | Crispin | ................... H01L 37/00 136/203 |

FOREIGN PATENT DOCUMENTS

| | | |
|---|---|---|
| JP | S5193193 A | 8/1976 |
| JP | H04190572 A | 7/1992 |

(Continued)

OTHER PUBLICATIONS

International Search Report (and English translation) and Written Opinion of the International Searching Authority for International Application No. PCT/JP2019/030800 (dated Oct. 15, 2019).

(Continued)

*Primary Examiner* — Sadie White
(74) *Attorney, Agent, or Firm* — Heslin Rothenberg Farley & Mesiti P.C.

(57) ABSTRACT

An object of the present invention is to provide a stable thermoelectric battery. The object can be solved by a thermoelectric battery comprising a working electrode containing a n-type silicon and germanium, a counter electrode, and a solid electrolyte having a polymer having a specific repeating unit with a molecular weight of 200 to 1,000,000, or a derivative thereof, wherein the solid electrolyte contains copper ions or iron ions as an ion source.

9 Claims, 14 Drawing Sheets

(56) References Cited

FOREIGN PATENT DOCUMENTS

| | | |
|---|---|---|
| JP | 2003219669 A | 7/2003 |
| JP | 2010147236 A | 7/2010 |
| WO | 0171821 A1 | 9/2001 |
| WO | 2012140856 A1 | 10/2012 |
| WO | 2017038988 A1 | 3/2017 |

OTHER PUBLICATIONS

Date et al., "Progress of Thermoelectric Power Generation Systems: Prospect For Small to Medium Scale Power Generation," Renewables and Sustainable Energy Reviews 33:371-381 (2014).
"Photonics Series 3 Solar Cells", edited by Yoshihiro Hamakawa, Corona Publishing Co., Ltd. (2004).

* cited by examiner (a)

(b)

(a)

(b)

(a)

(b)

(a)

(b)

(a)

(b)

(a)

(b)

(c)

(d)

(a)

(b)

(a)

(b)

(a)

(b)

(a)

(b)

(a)

(b)

(a)

(b)

(a)

(b)

(c)

HEAT-UTILIZING POWER GENERATION BATTERY AND HEAT-UTILIZING POWER GENERATION METHOD USING SAME

CROSS REFERENCE TO RELATED APPLICATIONS

This application is a national stage application under 35 U.S.C. § 371 of International Application No. PCT/JP2019/030800, filed on Aug. 6, 2019, which claims priority of Japanese Application No. 2018-147465, filed on Aug. 6, 2018, which are hereby incorporated by reference in their entirety.

TECHNICAL FIELD

The present invention relates to a thermoelectric battery, and a process for generating thermoelectricity using the same. According to the present invention, it is possible to generate electricity efficiently by using heat.

BACKGROUND ART

Hitherto, a thermoelectric generation using the Seebeck effect has been known as heat-utilizing electric generation using geothermal heat or exhaust heat of factories (Patent literature 1 and 2, and Non-patent literature 1). It is expected to be put into practical use in order to efficiently use thermal energy. Thermoelectric generation by the Seebeck effect uses the power generation principle in which a voltage is generated when a temperature gradient is provided on a metal or a semiconductor. Specifically, in a thermoelectric generation system, thermal energy is converted into electrical energy by applying a temperature gradient to a thermoelectric conversion element in which a p-type semiconductor and an n-type semiconductor are connected.

However, the conventional thermoelectric conversion element using the temperature gradient has problems such as the high price of the semiconductors constituting the thermoelectric conversion element, the high operating temperature range, and the low conversion efficiency. Further, there is a problem that a physical durability of a joint is weak and thus it cannot be installed in a place where vibration is applied. Furthermore, since the electric generation requires the temperature gradient, the installation location is limited. In some cases, it is necessary to use a cooling device for the temperature gradient. In particular, one dimension of the thermoelectric conversion module is used for the temperature gradient. Therefore, it is necessary to use it two-dimensionally for the heat source. In other words, it has the disadvantage that all the surrounding heat cannot be used three-dimensionally and thus the heat utilization efficiency is low.

CITATION LIST

Patent Literature

[Patent literature 1] JP 2010-147236 A
[Patent literature 2] JP 2003-219669 A
[Patent literature 3] WO2017/038988 A

Non-Patent Literature

[Non-patent literature 1] Renewable and Sustainable Energy Reviews (Netherlands) 2014, vol. 33, p. 371

[Non-patent literature 2] "Photonics Series 3 Solar Cells" edited by Yoshihiro Hamakawa 2004, Corona Publishing Co., Ltd.

SUMMARY OF INVENTION

Technical Problem

The present inventors developed a thermoelectric battery capable of converting thermal energy into electrical energy by combining a thermoelectric conversion material that generates thermally excited electrons and holes with an electrolyte (Patent Document 3). The present inventors further have researched and found that an excellent thermoelectric battery can be obtained by using an inorganic solid germanium as the thermoelectric conversion material. However, they thought that it was necessary to further stabilize the battery characteristics and extend the battery life Therefore, an object of the present invention is to provide a stable thermoelectric battery.

Solution to Problem

The present inventor have conducted intensive studies on the stable thermoelectric battery, and as a result, surprisingly found that a stable thermoelectric battery can be obtained by using n-type silicon and germanium as a working electrode, and a polymer having a specific repeating unit with a molecular weight of 200-1,000,000 or a derivative thereof as an electrolyte. Further, it is found that the battery life can be extended by adding alkali metal ions as an additive.

In the present specification, the thermoelectric battery means a thermoelectric generation element comprising a positive electrode and/or a negative electrode.

The present invention is based on the above findings.
The present invention relates to:
[1] a thermoelectric battery comprising a working electrode containing a n-type silicon and germanium, a counter electrode, and a solid electrolyte having a polymer represented by the following formula (1) or a derivative thereof:

[Chemical formula 1]

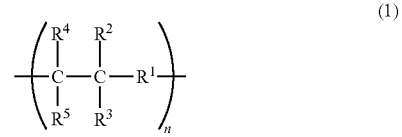

wherein R1 is a single bond, an oxygen atom, a sulfur atom, —NH—, —PH$_3$—, —(P=O)R$^6$—, —O—(P=O)H—O—, carbonate group (—O—(C=O)—O—), a carbonyl group, a sulfonyl group, an ester group, or an allylene dioxy group (—O—Ar—O—), R2, R3, R4, and R5 are independently a hydrogen atom, a fluorine atom, an alkyl group having 1 to 3 carbon atoms, a hydroxyl group, a cyano group, an amino group, a carboxyl group, a phosphoryl group, an aldehyde group, a methylcarbonyl group, a methylsulfonyl group, a sulfanyl group (—SH), a nitro group, a phenoxy group, a methyl ester group, a trifluoromethyl group, R6 is an alkylene group having 1 to 3 carbon atoms,
the repeating unit may be the same, or combinations of two or more repeating units, wherein a molecular weight of the polymer or the derivative is 200 to 1,000,000, and the solid electrolyte contains copper ions or iron ions as an ion source,

[2] the thermoelectric battery of the item [1], wherein the solid electrolyte comprises alkali metal ions,

[3] the thermoelectric battery of the item [2], wherein the alkali metal ions are comprised therein as LiCl or KCl,

[4] the thermoelectric battery of the items [1] to [3], wherein the copper ions are monovalent and divalent copper ions,

[5] the thermoelectric battery of the items [1] to [4], wherein the n-type silicon and germanium are laminated via chromium in the working electrode,

[6] the thermoelectric battery of the items [1] to [5], wherein the polymer is selected from the group consisting of polyvinylidene fluoride, polyvinyl alcohol, polyethylene glycol, polypropylene glycol, polyethylene carbonate, and polypropylene carbonate, or a derivative thereof,

[7] a process for generating thermoelectricity, comprising the step of heating the thermoelectric battery of the items [1] to [6], to 25° C. or more to generate electricity, and

[8] the process for generating thermoelectricity of the item [7], further comprising: the step of leaving it in an insulated state after the step of heating and generating electricity, and the step of heating the thermoelectric battery to 25° C. or more to generate electricity.

Further, the present specification discloses:

[1] a thermoelectric battery comprising a working electrode containing a n-type silicon and germanium, a counter electrode, and a solid electrolyte having a polymer or a derivative thereof with a molecular weight of 200 to 600,000, wherein the solid electrolyte contains copper ions or iron ions as an ion source,

[2] the thermoelectric battery of the item [1], wherein the solid electrolyte comprises alkali metal ions,

[3] the thermoelectric battery of the item [2], wherein the alkali metal ions are comprised therein as LiCl or KCl,

[4] the thermoelectric battery of the items [1] to [3], wherein the copper ions are monovalent and divalent copper ions,

[5] the thermoelectric battery of the items [1] to [4], wherein the n-type silicon and germanium are laminated via chromium in the working electrode,

[6] a process for generating thermoelectricity, comprising the step of heating the thermoelectric battery of the items [1] to [5], to 25° C. or more to generate electricity,

[7] the process for generating thermoelectricity of the item [6], further comprising: the step of leaving it in an insulated state after the step of heating and generating electricity, and the step of heating the thermoelectric battery to 25° C. or more to generate electricity.

Advantageous Effects of Invention

According to the thermoelectric battery of the present invention, the heat-utilizing electric generation can be stably carried out. Further, according to one embodiment of the present invention, a long life thermoelectric battery can be obtained.

DESCRIPTION OF EMBODIMENTS

[1] Thermoelectric Battery

Figure 1:
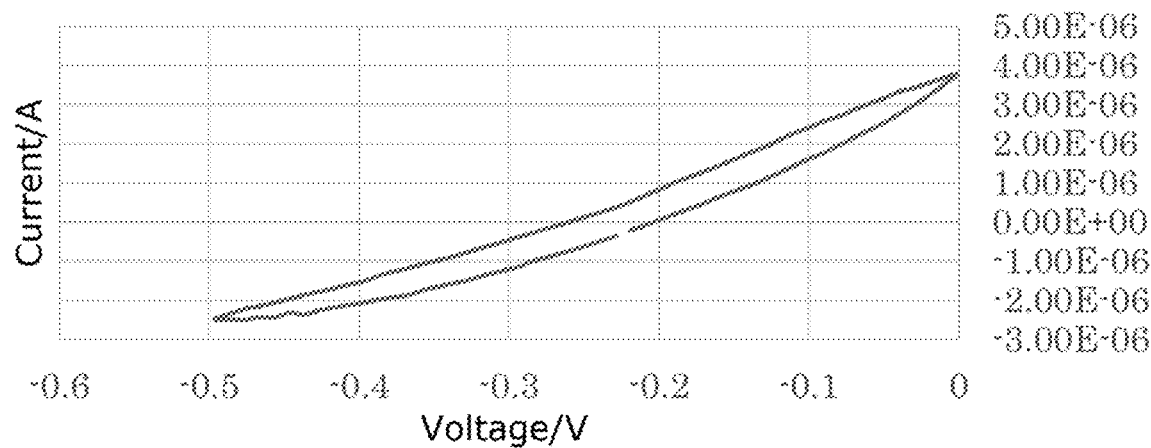
FIG. 1 is graphs showing a CV measurement (a) and a discharge measurement (b) of the thermoelectric cell obtained in Example 1.
Figure 1:
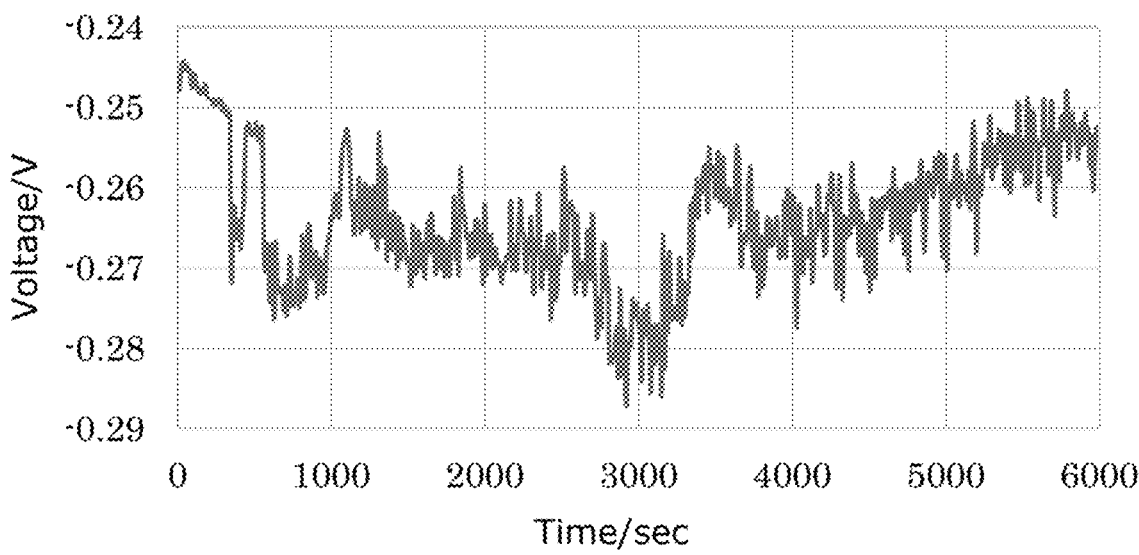

A thermoelectric battery of the present invention comprises a working electrode containing a n-type silicon and germanium, a counter electrode, and a solid electrolyte having a polymer represented by the following formula (1) or a derivative thereof, with a molecular weight of 200 to 1,000,000:

[Chemical formula 2]

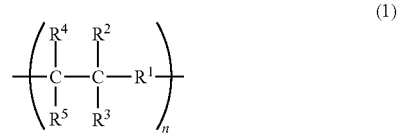

(1)

wherein R1 is a single bond, an oxygen atom, a sulfur atom, —NH—, —PH$_3$—, —(P=O)R$^6$—, —O—(P=O)H—O—, carbonate group (—O—(C=O)—O—), a carbonyl group, a sulfonyl group, an ester group, or an allylene dioxy group (—O—Ar—O—), R2, R3, R4, and R5 are independently a hydrogen atom, a fluorine atom, an alkyl group having 1 to 3 carbon atoms, a hydroxyl group, a cyano group, an amino group, a carboxyl group, an aldehyde group, a methylcarbonyl group, a methylsulfonyl group, a phosphoryl group, a sulfanyl group (—SH), a nitro group, a phenoxy group, a methyl ester group, a trifluoromethyl group, R6 is an alkylene group having 1 to 3 carbon atoms, the repeating unit may be the same, or combinations of two or more repeating units, and the solid electrolyte contains copper ions or iron ions as an ion source.

The allylene dioxy group includes, for example, a phenylene dioxy group or naphthylene dioxy group.

<<Working Electrode>>

The working electrode of the present invention is not limited, so long as it contains the n-type silicon and germanium. Germanium is a thermoelectric conversion material that generates holes and electrons, and can generate thermally excited electrons with about $10^{18}/cm^3$ holes.

The n-type silicon is an electron-transport material that transports the thermally excited electrons generated by the thermoelectric conversion material. The n-type silicon can be obtained by adding a small amount of pentavalent element such as phosphorus as an impurity to pure silicon. Pure silicon having four valence electrons, is an insulator because electrons do not move. However, the n-type silicon contains phosphorus with five valence electrons and so on. Thus, extra electron moves freely and it becomes a conductor. As the pentavalent element, there may be mentioned, for example, phosphorus or arsenic.

The weight ratio of the n-type silicon and germanium in the working electrode is not particularly limited, so long as the effect of the present invention can be achieved, but is 1000:1 to 10:1, more preferably 500:1 to 100:1. By the above range, the n-type silicon can efficiently transport the thermally excited electrons generated by germanium.

The working electrode in the present invention can be produced, for example, by laminating germanium on the n-type silicon. However, when germanium is directly laminated on the n-type silicon, the bond therebetween may be weak. Therefore, for example, it is preferable to laminate the n-type silicon and germanium via a binder. As the binder, there may be mentioned chromium, nickel, titanium or tin. The amount of the binder is not particularly limited, so long as the bond between n-type silicon and germanium can be strengthened. However, 0.001 to 1 parts by volume of the binder may be used with respect to 100 parts by volume of germanium.

<<Counter Electrode>>

The counter electrode of the present invention is not limited, so long as it can transport electrons, but for example, includes fluorine-doped tin oxide (FTO), tin-doped indium oxide (ITO), antimony-doped tin oxide (ATO), aluminum-doped zinc oxide (AZO), gallium-doped zinc oxide (GZO), zinc oxide (ZnO), indium oxide (In2O3), tin oxide (SnO2), IZO (In—Zn—O), or IGZO (In—Ga—Zn—O). In addition, there may be mentioned metals that do not react with copper ions or iron ions, such as titanium, gold, platinum, silver, tungsten, tantalum, stainless steel, graphene, indium, rhodium, chromium, carbon, their alloys or combinations thereof.

The counter electrode may be provided as a counter electrode layer or in the form of a conducting wire. In the case of the counter electrode layer, it can be manufactured by a vacuum deposition method or a spin coating method.

<<Solid Electrolyte>>

The solid electrolyte comprises a polymer represented by the following formula (1) or a derivative thereof (hereinafter, sometimes referred to as polymer and the like), with a molecular weight of 200 to 1,000,000:

[Chemical formula 3]

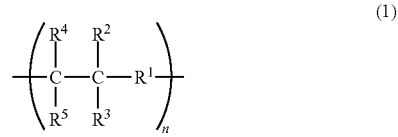

(1)

wherein R1 is a single bond, an oxygen atom, a sulfur atom, —NH—, —PH$_3$—, —(P=O)R$^6$—, —O—(P=O)H—O—, carbonate group (—O—(C=O)—O—), a carbonyl group, a sulfonyl group, an ester group, or an allylene dioxy group (—O—Ar—O—), R2, R3, R4, and R5 are independently a hydrogen atom, a fluorine atom, an alkyl group having 1 to 3 carbon atoms, a hydroxyl group, a cyano group, an amino group, a carboxyl group, an aldehyde group, a methylcarbonyl group, a methylsulfonyl group, a phosphoryl group, a sulfanyl group (—SH), a nitro group, a phenoxy group, a methyl ester group, a trifluoromethyl group, R6 is an alkylene group having 1 to 3 carbon atoms, the repeating unit may be the same, or combinations of two or more repeating units. The polymer may be a polymer consisting of the repeating units of the formula (1). Further, the solid electrolyte may be a solid electrolyte consisting of the polymer or the derivative thereof.

The polymer is not particularly limited, so long as it has the repeating units encompassed in the formula (1), but for example, includes polyvinylidene fluoride, polyvinyl alcohol, polyethylene glycol, polypropylene glycol, polyethylene carbonate, or polypropylene carbonate.

Two terminal groups are not particularly limited, as long as the effects of the present invention can be achieved, but for example, includes a hydrogen atom, a hydroxyl group, an alkyloxyran group having 1 to 6 carbon atoms, an acryloyl group, an alkyl carboxyl group having 1 to 6 carbon atoms, an alkylamino group having 1 to 6 carbon atoms, an alkyl group having 1 to 6 carbon atoms, an aldehyde group, an alkylaldehyde group having 1 to 6 carbon atoms, an alkylamide group having 1 to 6 carbon atoms, an alkylazide group having 1 to 6 carbon atoms, an alkyl hydrazide group having 1-6 carbon atoms, an alkylisocyanate group having 1 to 6 carbon atoms, an alkylmaleimide group having 1 to 6 carbon atoms, a sulfonyl group, an amino group, or a thiol group. However, it is preferably a hydrogen atom and/or a hydroxyl group.

The derivative of the polymer may have a substituent at the side chain. That is, the hydrogen atom at the side chain may be substituted. The substituent is not particularly limited. However, common groups such as an amino group, a carboxyl group, an alkyl group, aryl group, glycidyl group, cyano group, methylsulfonyl group, phosphoryl group, and nitro group can be used.

The molecular weight of the polymer or derivative thereof is 200 to 1,000,000, preferably 400 to 100,000, more preferably 400 to 20,000, even more preferably 400 to 6,000, and most preferably 600 to 2,000.

In the present specification, the molecular weight of the polymer or the derivative thereof means the weight average molecular weight converted to polystyrene, measured by gel permeation chromatography (GPC). As an example of specific measurement conditions for the weight average molecular weight, for example, the following measurement conditions can be mentioned.

GPC device: HLC-8120 (Tosoh Corporation):
Column: TSK gel Multipore HXL-M (Tosoh Corporation, 7.8 mm ID (inner diameter)×30.0 cm)
Eluent: Tetrahydrofuran (THF)

<<Polyethylene Glycol>>

The solid electrolyte comprises polyethylene glycol or a derivative thereof (hereinafter, sometimes referred to as polyethylene glycol and the like) with a molecular weight of 200 to 1,000,000, as an embodiment.

Polyethylene glycol (PEG) is a polymer compound obtained by polymerizing ethylene glycol and is represented by the formula HO—(CH2-CH2-O)$_{n-1}$—CH2-CH2-OH. That is, a repeating unit of polyethylene glycol is represented by the following formula (2).

[Chemical formula 4]

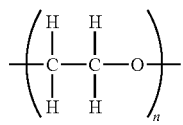

(2)

The derivative of polyethylene glycol is not particularly limited, but includes a derivative in which one or both of hydrogen atoms (—H) at both ends are substituted with a substituent. As the substituent, there may be mentioned an alkyloxyran group having 1 to 6 carbon atoms, an acryloyl group, an alkyl carboxyl group having 1 to 6 carbon atoms, an alkylamino group having 1 to 6 carbon atoms, an alkyl group having 1 to 6 carbon atoms, an aldehyde group, an alkylaldehyde group having 1 to 6 carbon atoms, an alkylamide group having 1 to 6 carbon atoms, an alkylazide group having 1 to 6 carbon atoms, an alkyl hydrazide group having 1-6 carbon atoms, an alkylisocyanate group having 1 to 6 carbon atoms, an alkylmaleimide group having 1 to 6 carbon atoms, a sulfonyl group, an amino group, or a thiol group. As a concrete derivative, there may be mentioned polyethylene glycol diglycidyl ether, polyethylene glycol diacrylate, H$_2$N—(CH$_2$—CH$_2$—O)$_{n-1}$—CH$_2$—CH$_2$—O—CH$_2$—CH$_2$—COOH, H$_2$N—(CH$_2$—CH$_2$—O)$_{n-1}$—CH$_2$—CH$_2$—O—CH$_2$—CH$_2$—NH$_2$, HOOC—(CH$_2$—CH$_2$—O)$_{n-1}$—CH$_2$—CH$_2$—O—CH$_2$—CH$_2$—COOH, HOOC—CH$_2$—CH$_2$—COO—(CH$_2$—CH$_2$—O)$_{n-1}$—CH$_2$—CH$_2$—O—CO—CH$_2$—CH$_2$—COOH, or polyethylene glycol dimethacrylate. The derivative of polyethylene glycol may have a substituent at the side chain. The substituent is not particularly limited. However, common groups such as an amino group, a carboxyl group, an alkyl group, aryl group, glycidyl group, cyano group, methylsulfonyl group, phosphoryl group, and nitro group can be used.

<<Polypropylene Glycol>>

The solid electrolyte comprises polypropylene glycol or a derivative thereof (hereinafter, sometimes referred to as polypropylene glycol and the like) with a molecular weight of 200 to 1,000,000, as an embodiment.

Polypropylene glycol (PPG) is a polymer compound obtained by polymerizing propylene glycol and is represented by the formula HO—(CH$_2$—CH$_2$(CH$_3$)—O)$_{n-1}$—CH$_2$—CH$_2$(CH$_3$)—OH. That is, a repeating unit of polypropylene glycol is represented by the following formula (3).

[Chemical formula 5]

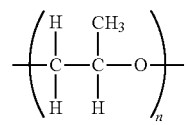

(3)

The derivative of polypropylene glycol is not particularly limited, but includes a derivative in which one or both of hydrogen atoms (—H) at both ends are substituted with a substituent. As the substituent of the ends, there may be mentioned the substituent described in item of "polyethylene glycol", and as the concrete derivative, there may be mentioned the derivative based on item of "polyethylene glycol." The derivative of polypropylene glycol may have a substituent at the side chain. As the substituent of the side chain, there may be mentioned the substituent described in item of "polyethylene glycol".

<<Polyethylene Carbonate>>

The solid electrolyte comprises polyethylene carbonate or a derivative thereof (hereinafter, sometimes referred to as polyethylene carbonate and the like) with a molecular weight of 200 to 1,000,000, as an embodiment.

Polyethylene carbonate (PEC) is a polymer compound obtained by polymerizing ethylene carbonate and is represented by the formula HO—(CH$_2$—CH$_2$—O—CO—O)$_{n-1}$—CH$_2$—CH$_2$—O—CO—OH. That is, a repeating unit of polyethylene carbonate is represented by the following formula (4).

[Chemical formula 6]

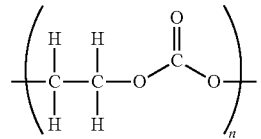

(4)

The derivative of polyethylene carbonate is not particularly limited, but includes a derivative in which one or both of hydrogen atoms (—H) at both ends are substituted with a substituent. As the substituent of the ends, there may be mentioned the substituent described in item of "polyethylene glycol", and as the concrete derivative, there may be mentioned the derivative based on item of "polyethylene glycol." The derivative of polyethylene carbonate may have a substituent at the side chain. As the substituent of the side chain, there may be mentioned the substituent described in item of "polyethylene glycol".

<<Polypropylene Carbonate>>

The solid electrolyte comprises polypropylene carbonate or a derivative thereof (hereinafter, sometimes referred to as polypropylene carbonate and the like) with a molecular weight of 200 to 1,000,000, as an embodiment.

Polypropylene carbonate (PPC) is a polymer compound obtained by polymerizing propylene carbonate and is represented by the formula HO—(CH$_2$—CH$_2$(CH$_3$)—O—CO—O)$_{n-1}$—CH$_2$—CH$_2$(CH$_3$)—O—CO—OH. That is, a repeating unit of polypropylene carbonate is represented by the following formula (5).

[Chemical formula 7]

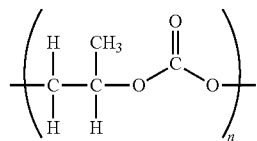

(5)

The derivative of polypropylene carbonate is not particularly limited, but includes a derivative in which one or both of hydrogen atoms (—H) at both ends are substituted with a substituent. As the substituent of the ends, there may be mentioned the substituent described in item of "polyethylene glycol", and as the concrete derivative, there may be mentioned the derivative based on item of "polyethylene glycol." The derivative of polypropylene carbonate may have a substituent at the side chain. As the substituent of the side chain, there may be mentioned the substituent described in item of "polyethylene glycol".

<<Polyvinylidene Fluoride>>

The solid electrolyte comprises polyvinylidene fluoride or a derivative thereof (hereinafter, sometimes referred to as polyvinylidene fluoride and the like) with a molecular weight of 200 to 1,000,000, as an embodiment.

Polyvinylidene fluoride (PVDF) is a polymer compound obtained by polymerizing vinylidene fluoride and is represented by the formula HO—(CH$_2$—CF$_2$)$_n$—H. That is, a repeating unit of polyvinylidene fluoride is represented by the following formula (6).

[Chemical formula 8]

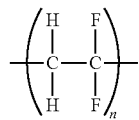

(6)

The derivative of polyvinylidene fluoride is not particularly limited, but includes a derivative in which one or both of hydrogen atoms (—H) at both ends are substituted with a substituent. As the substituent of the ends, there may be mentioned the substituent described in item of "polyethylene glycol", and as the concrete derivative, there may be mentioned the derivative based on item of "polyethylene glycol." The derivative of polyvinylidene fluoride may have a substituent at the side chain. As the substituent of the side chain, there may be mentioned the substituent described in item of "polyethylene glycol".

<<Polyvinyl Alcohol>>

The solid electrolyte comprises polyvinyl alcohol or a derivative thereof (hereinafter, sometimes referred to as polyvinyl alcohol and the like) with a molecular weight of 200 to 1,000,000, as an embodiment.

Polyvinyl alcohol (PVA) is a polymer compound obtained by polymerizing vinyl alcohol and is represented by the formula HO—(CH$_2$—CH(OH))$_n$—H. That is, a repeating unit of polyvinyl alcohol is represented by the following formula (7).

[Chemical formula 9]

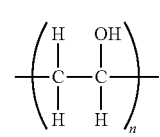

(7)

The derivative of polyvinyl alcohol is not particularly limited, but includes a derivative in which one or both of hydrogen atoms (—H) at both ends are substituted with a substituent. As the substituent of the ends, there may be mentioned the substituent described in item of "polyethylene glycol", and as the concrete derivative, there may be mentioned the derivative based on item of "polyethylene glycol." The derivative of polyvinyl alcohol may have a substituent at the side chain. As the substituent of the side chain, there may be mentioned the substituent described in item of "polyethylene glycol".

<<Poly(Vinylidene Fluoride-Co-Hexafluoropropylene)>>

The solid electrolyte comprises poly(vinylidene fluoride-co-hexafluoropropylene) or a derivative thereof (hereinafter, sometimes referred to as poly(vinylidene fluoride-co-hexafluoropropylene) and the like) with a molecular weight of 200 to 1,000,000, as an embodiment.

Poly(vinylidene fluoride-co-hexafluoropropylene) is a polymer compound obtained by copolymerizing vinylidene fluoride and hexafluoropropylene and is represented by the formula HO—(CH$_2$—CF$_2$)$_x$(CF$_2$—C(CF$_3$)F)$_7$—H. That is, a repeating unit of poly(vinylidene fluoride-co-hexafluoropropylene) is represented by the following formula (8).

[Chemical formula 10]

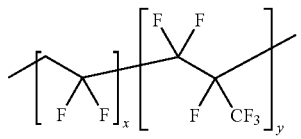

(8)

The derivative of poly(vinylidene fluoride-co-hexafluoropropylene) is not particularly limited, but includes a derivative in which one or both of hydrogen atoms (–H) at both ends are substituted with a substituent. As the substituent of the ends, there may be mentioned the substituent described in item of "polyethylene glycol", and as the concrete derivative, there may be mentioned the derivative based on item of "polyethylene glycol." The derivative of poly(vinylidene fluoride-co-hexafluoropropylene) may have a substituent at the side chain. As the substituent of the side chain, there may be mentioned the substituent described in item of "polyethylene glycol".

The solid electrolyte in the present invention means a solid electrolyte that is quasi-solid at a high temperature.

<<Ion Source>>

The ion source contained in the solid electrolyte of the present invention is not particularly limited, as long as it is a copper ion or an iron ion, and there may be mentioned a monovalent copper ion, a divalent copper ion, a divalent iron ion, or a trivalent iron ion. However, copper ions or iron ions are preferably stable two types of ions with different valences. This is because one ion is oxidized or reduced to the other ion, which can transport the electrons and the holes.

Therefore, in the case of copper ion, the monovalent copper ion and the divalent copper ion are preferable, and in the case of iron ion, the divalent iron ion and the trivalent iron ion are preferable. As the monovalent copper ion, for example, CuCl, CuBr, copper (I) acetate, copper (I) iodide or copper (I) sulfate can be used. As the divalent copper ion ion, $CuCl_2$, $CuTSFI_2$, copper (II) acetate, copper (II) sulfate or copper (II) acetylacetonate can be used. As the divalent iron ion, $Fe(C_5H_5)_2$(ferrocene), $K_4[Fe(CN)_6]$, iron (II) acetylacetonate, iron (II) chloride, iron (II) sulfate, or iron (II) acetate can be used. As the trivalent iron, $FeCl_3$, $K_3[Fe(CN)_6]$, iron (III) acetylacetonate or iron (III) sulfate can be used.

A concentration of the ion source is not particularly limited, as long as the effects of the present invention can be achieved. However, the ion source is preferably added so as to be 0.01 to 98 mol % with respect to the polymer or the like. By the above range, the ion source can efficiently transport the electrons and the holes.

The solid electrolyte may contain other substances. The other substances are not limited, but for example, there may be mentioned polar solvents that dissolve or disperse ion sources (water, methanol, toluene, tetrahydrofuran, or the like), binders (polyvinyl alcohol, methylcellulose, acrylic resin, agar, or the like), sintering aids that help a forming of hole-transmitting materials (magnesium oxide, yttrium oxide, calcium oxide, or the like).

<<Additive>>

The thermoelectric battery preferably comprises an alkali metal ion as an additive. As the alkali metal ion, there may be mentioned lithium ion, sodium ion, potassium ion, rubidium ion, cesium ion, or franchium ion, but lithium ion, sodium ion, or potassium ion is preferable. It is possible to extend the battery life by containing alkali metal ions, and to restore the discharge characteristics by leaving it in a heat source. The alkali metal ion is preferably added to the solid electrolyte in the form of a halide, although it is not limited. Halogen forming the halide with the metal ion includes fluorine, chlorine, bromine, iodine, or astatine. For example, a compound of the alkali metal ion and chlorine includes LiCl, NaCl, KCl, RbCl, CsCl, or FrCl, but LiCl, NaCl, or KCl are preferable.

An added amount of the alkali metal halide (such as LiCl or KCl) is not particularly limited, so long as the battery life can be extended, but is 0.001 to 100 parts by weight with respect to 100 parts by weight of the polymer such as PEG, preferably 0.01 to 10 parts by weight, more preferably 0.03 to 0.1 parts by weight. By the above range, a remarkable excellent effect of extending the battery life can be achieved.

<<Inorganic Oxide>>

The thermoelectric battery of the present invention may contain an inorganic oxide, although it is not limited thereto. The inorganic oxide is not particularly limited as long as the effects of the present invention can be achieved, but includes titanium oxide ($TiO_2$), aluminum oxide ($Al_2O_3$), or silicon dioxide ($SiO_2$). The inclusion of inorganic oxides can improve a strength of solid electrolyte and prevent short circuit.

<<Function>>

The mechanisms by which the thermoelectric battery of the present invention can stably generate electricity and exhibit an excellent battery life has not been fully elucidated, but may be presumed to be as follows. However, the present invention is not limited by the following presumption.

In the thermoelectric battery of the present invention, the polymer having a specific repeating unit with a molecular weight of 200-1,000,000 or the derivative thereof as the solid electrolyte is used. In the process for generating thermoelectricity, it is possible to operate for a long term, by controlling the balance between the redox reaction of ions and the diffusion of ions. That is, it is important that the redox ions on the electrode surface reach redox equilibrium in the electrolyte. By using the polymer or the derivative thereof, the diffusion rate of ions can be effectively controlled even at high temperatures. Furthermore, in order to widen the operating temperature range, a stable polymer is required in the high temperature range, and it is presumed that the thermoelectric battery of the present invention can stably generate electricity.

Further, the thermoelectric battery of the present invention contains an alkali metal ion as an additive, so that the discharge maintenance time of the thermoelectric battery is dramatically extended. It is presumed that the alkali metal ions indirectly interact with the redox copper ions or iron ions on the electrode surface to promote the diffusion of the copper ions or iron ions into the solid electrolyte. Furthermore, the diffusion of copper ions or iron ions due to the indirect interaction with copper ions or iron ions is considered to be particularly promoted in the insulated state where the electric generation is terminated. Therefore, it is presumed that the discharge characteristics of the thermoelectric battery can be restored after the insulated state.

In addition, it is presumed that the polymer can effectively control the diffusion rate of ions even at high temperatures by having two carbon atoms in the repeating unit or combination thereof. Furthermore, Furthermore, since $R^2$, $R^3$, $R^4$, and $R^5$ are specific groups such as the alkyl group, fluorine atom, and the hydroxyl group, it is presumed that the diffusion rate of ions can be effectively controlled even at high temperatures.

In the thermoelectric battery of the present invention, a conductor such as metal that do not react with copper ions or iron ions, for example, titanium, gold, platinum, silver, tungsten, tantalum, stainless steel, graphene, indium, rhodium, chromium, carbon, their alloys or combinations thereof, may be applied to the working electrode and/or counter electrode. The same material may be used for the working electrode and the counter electrode.

The conductor may be provided in the form of a conducting wire, or may be provided as a layer of the conductor. In the case of the conductor layer, it can be manufactured by a vacuum deposition method or a spin coating method.

[2] Process for Generating Thermoelectricity

The process for generating thermoelectricity of the present invention comprises the step of heating the thermoelectric battery to 25° C. or more to generate electricity (step of heating and generating electricity). The heating temperature is not particularly limited as long as the thermoelectric battery of the present invention can generate electricity. That is, it is not particularly limited, as long as germanium can generate a sufficient number of thermally excited electrons and holes for electric generation, and the electric charge transport ion pair can move in the electrolyte, but is, for example, 25° C. or more, preferably 35° C. or more, more preferably 50° C. or more, and further preferably 80° C. or more. The upper limit of the temperature is not particularly limited as long as the electric charge transport ion pair can move in the electrolyte, but is, for example, 300° C. or less, preferably 120° C. or less.

The temperature at which the thermoelectric battery of the present invention is actually operated, is determined, in addition to the temperatures at which germanium produces a sufficient number of thermally excited electrons and holes for electric generation, by the ease of electron transfer peculiar to materials or the ease of electron transfer at an interface of the combination of the solid electrolyte and germanium. However, these conditions can be examined as appropriate.

The process for generating thermoelectricity of the present invention may comprises the step of leaving it in an insulated state after the step of heating (leaving step) and generating electricity, and the step of heating the thermoelectric battery to 25° C. or more to generate electricity (step of heating and generating electricity). The insulated state in the leaving step means, for example, a state after the step of turning off the switch. By the leaving step, an ion source such as copper ion or iron ion is diffused in the solid electrolyte, and it is possible to efficiently heat and generate electricity. Further, the battery life can be extended.

The ion source diffuses even after being left for a few minutes, and therefore the leaving time is not particularly limited. However, considering the state of diffusion of the ion source, for example, it is 1 hour or more, preferably 2 hours or more, more preferably 6 hours or more, and further preferably 12 hours or more. The longer the leaving time, the more the ion source diffuses, and therefore, the upper limit thereof is not limited, but is preferably within 2 days for efficient electric generation.

Further, in the process for generating thermoelectricity of the present invention, the leaving step and the step of heating and generating electricity may be repeated two or more times. The number of repetitions of the leaving step and the step of heating and generating electricity is not particularly limited.

EXAMPLES

The present invention will be described in detail hereinafter using working examples, but these working examples do not limit the scope of the present invention.

Example 1

In this example, a thermoelectric cell was prepared using PEG600 as the solid electrolyte and CuCl as the ion source.

The following working electrode was used. 20 nanometers of Cr was deposited as a binder on n-Si having a thickness of about 0.5 mm, and 2 μm of Ge was deposited thereon, and it was cut into 25×15×0.5 mm.

As the counter electrode, fluorine-doped tin oxide (FTO, sheet resistance 7Ω/□, Aldrich) cut to a size of 25×15×2.2 mm was used.

The electrolyte was prepared by applying 0.1 g of PEG600 (Wako) in a mortar, adding CuCl (0.01 g), and stirring for 10 minutes. The resulting electrolyte (1 μL) was dropped onto the germanium of the working electrode. A thermally-resistant insulating double-sided tape (Kapton tape with 5 mm holes) was used as a spacer to bond the germanium side of the working electrode and the FTO of the counter electrode. That is, the electrode area of the power generation part was a circle with a diameter of 5 mm, i.e., 78.5 square millimeters.

The resulting cell was placed in a constant-temperature bath. CV measurement was performed at a scan rate of 10 mV/sec by potential scanning. A discharge measurement was performed at 10 nanoamperes. The results are shown in Table 1 and FIG. 1. Power generation characteristics with an open circuit voltage of about 0.2 V and a short-circuit current of 4 microamperes were observed (FIG. 1a). A discharge at 10 nanoamperes continued for 2 hours or more. (FIG. 1b).

Example 2

In this example, the procedure described in Example 1 was repeated except for using acetonitrile (ACN) as the additive, to prepare a thermoelectric cell.

Figure 2:
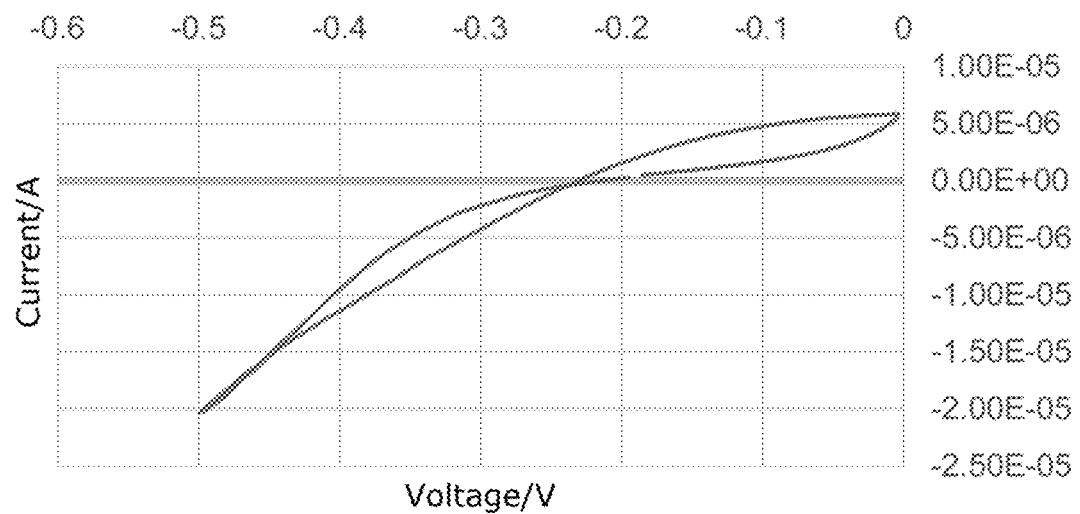
FIG. 2 is graphs showing a CV measurement (a) and a discharge measurement (b) of the thermoelectric cell obtained in Example 2.
Figure 2:
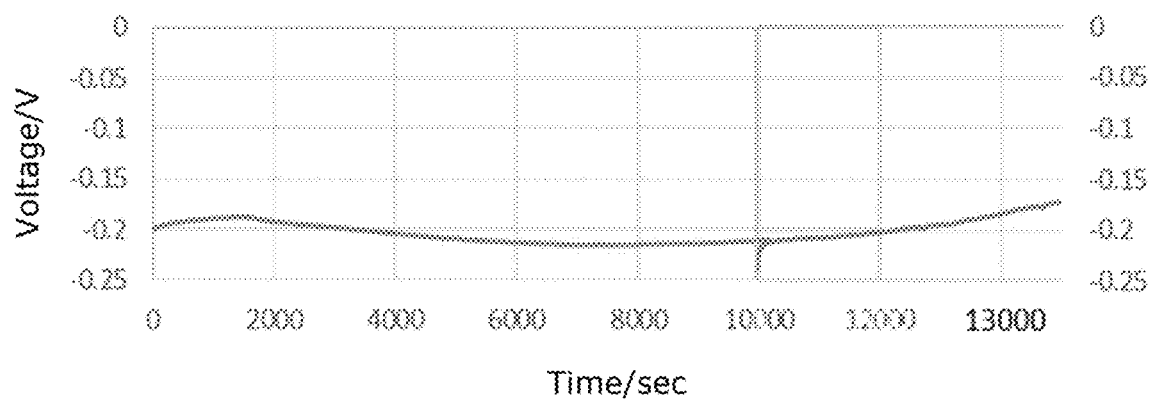

0.1 g of PEG600 was applied in a mortar, and CuCl (0.01 g) and ACN (0.25 mL) as the additive were added thereto, and then ACN was evaporated by allowing to stand at 80° C. for 20 minutes, to prepare the electrolyte. The results are shown in Table 1 and FIG. 2.

Power generation characteristics with an open circuit voltage of about 0.2 V and a short-circuit current of about 5 microamperes were observed (FIG. 2a). A stable discharge at about 0.2V and 10 nanoamperes was continued for about 4 hours. (FIG. 2b).

Example 3

In this example, the procedure described in Example 2 was repeated except for using PEG2000 instead of PEG600 as the solid electrolyte, to prepare a thermoelectric cell.

Figure 3:
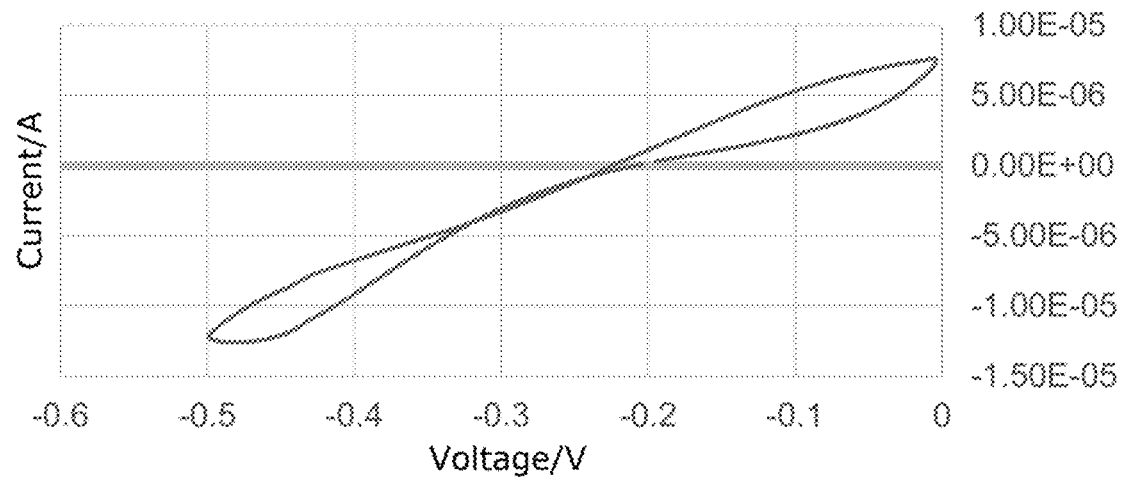
FIG. 3 is graphs showing a CV measurement (a) and a discharge measurement (b) of the thermoelectric cell obtained in Example 3.
Figure 3:
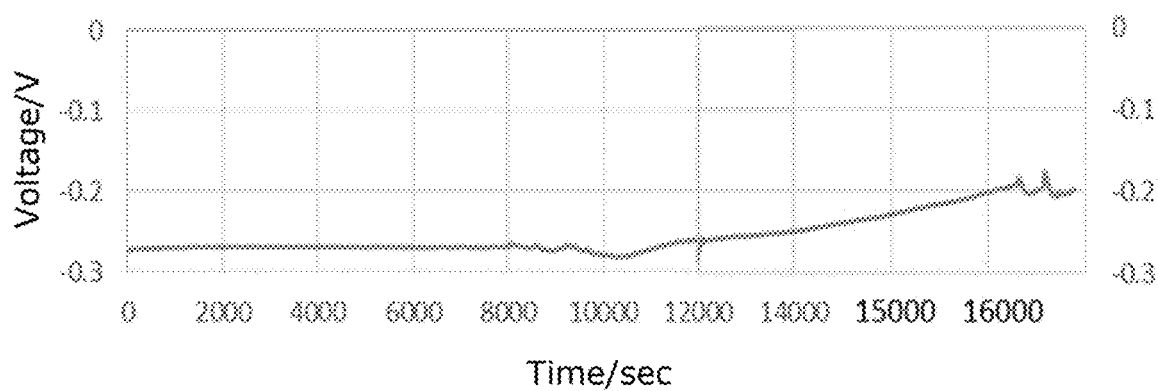

0.1 g of PEG2000 was applied in a mortar, and CuCl (0.01 g) and ACN (0.5 mL) as the additive were added thereto, and the whole was stirred for 10 minutes at 80° C. ACN was evaporated by allowing to stand at 80° C. for 20 minutes, to prepare the electrolyte. The results are shown in Table 1 and FIG. 3.

Power generation characteristics with an open circuit voltage of about 0.2 V and a short-circuit current of 7 microamperes were observed (FIG. 3a). A stable discharge at 10 nanoamperes was continued for about 4.5 hours. (FIG. 3b).

Example 4

In this example, the procedure described in Example 2 was repeated except for using a mixture of PEG600 and PEDE500 instead of PEG600 as the solid electrolyte, to prepare a thermoelectric cell.

Figure 4:
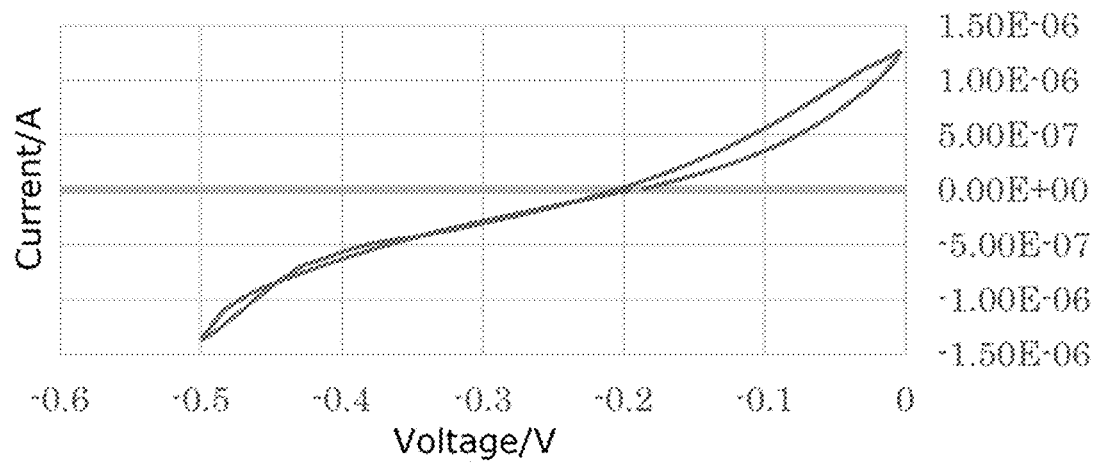
FIG. 4 is graphs showing a CV measurement (a) and a discharge measurement (b) of the thermoelectric cell obtained in Example 4.
Figure 4:
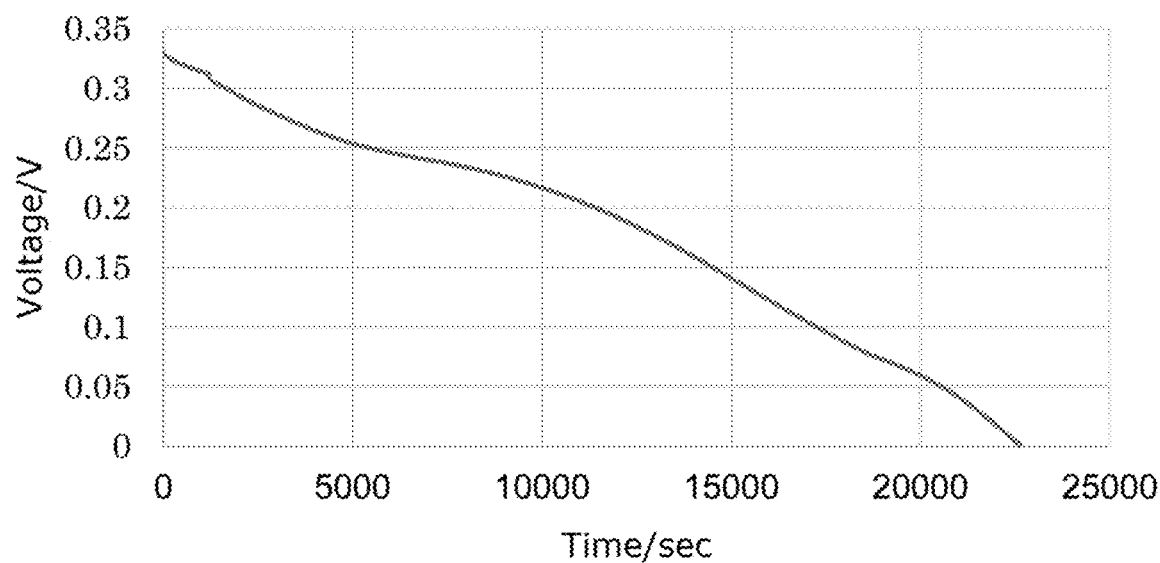

0.1 g of PEG600 and 0.1 g of PEDE500 were applied in a mortar, and CuCl (0.02 g) and ACN (0.5 mL) as the additive were added thereto, and the whole was stirred for 10 minutes at 80° C. ACN was evaporated by allowing to stand at 80° C. for 20 minutes, to prepare the electrolyte. The results are shown in Table 1 and FIG. 4.

An electric generation with an open circuit voltage of about 0.2 V and a short-circuit current of 1.3 microamperes were observed (FIG. 4a). A discharge at 10 nanoamperes was continued for 6 hours. (FIG. 4b).

Example 5

In this example, the procedure described in Example 1 was repeated except for using $FeCl_3$ instead of CuCl as the ion source, to prepare a thermoelectric cell.

Figure 5:
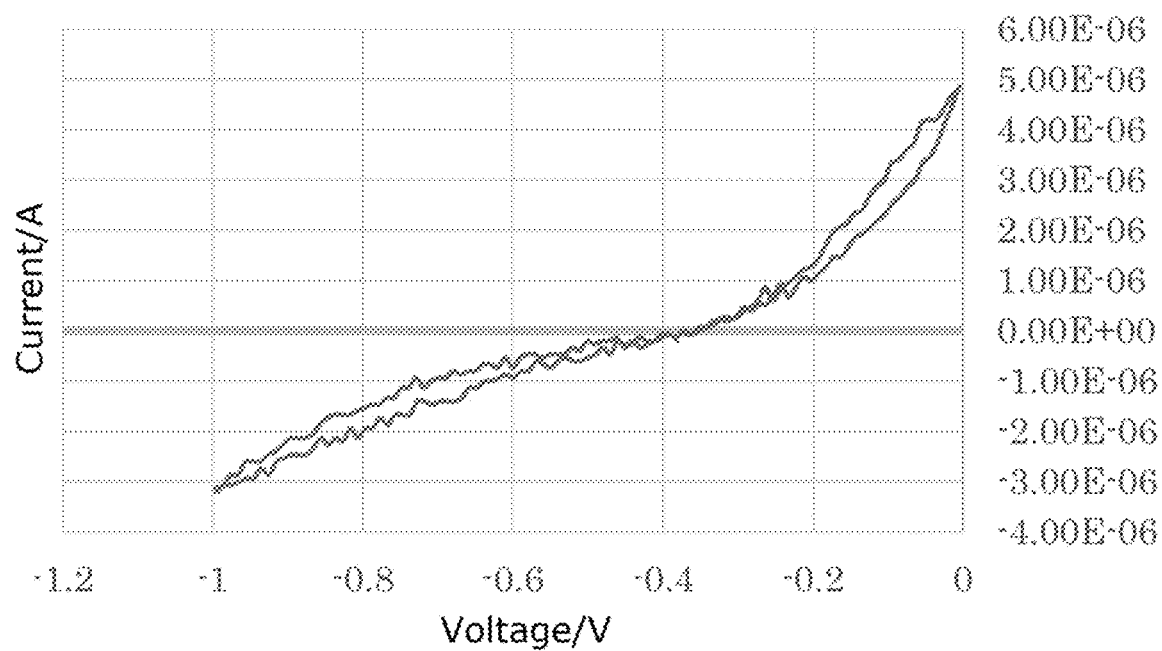
FIG. 5 is graphs showing a CV measurement (a) and a discharge measurement (b) of the thermoelectric cell obtained in Example 5.
Figure 5:
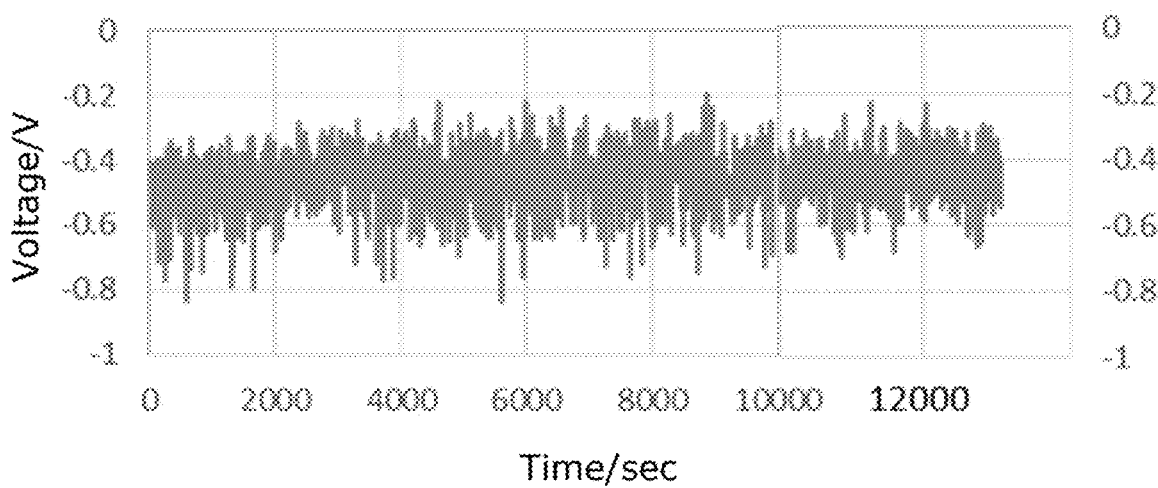

1 g of PEG600 was applied in a mortar, and $FeCl_3$ (0.162 g) was added thereto. The electrolyte was prepared by solving $FeCl_3$ into PEG at 80° C. The results are shown in Table 1 and FIG. 5.

Power generation characteristics with an open circuit voltage of about 0.4 V and a short-circuit current of about 5 microamperes were observed (FIG. 5a). A stable discharge at 10 nanoamperes was observed for about 4 hours. (FIG. 5b).

Comparative Example 1

In this comparative example, the procedure described in Example 1 was repeated except for using Ge only instead of n-Si and Ge as the working electrode, and ferrocene instead of CuCl as the ion source, to prepare a thermoelectric cell.

The following working electrode was used. 20 nanometers of Cr was deposited as a binder on n-Si having a thickness of about 0.5 mm, and 2 μm of Ge was deposited thereon, and it was cut into 25×15×0.5 mm.

As the counter electrode, fluorine-doped tin oxide (FTO, sheet resistance 7Ω/□, Aldrich) cut to a size of 25×15×2.2 mm was used.

The electrolyte was prepared by applying 0.1 g of PEG600 (Wako) in a mortar, adding Ferrocene (0.0093 g), and stirring for 10 minutes. The results are shown in Table 1.

An open circuit voltage was about 0.5 V, but a low short-circuit current of about 0.1 microamperes and a short discharge maintenance time of 40 minutes were observed.

Comparative Example 2

In this comparative example, the procedure described in Example 1 was repeated except for using $SnCl_2 \cdot H_2O$ instead of CuCl as the ion source, to prepare a thermoelectric cell.

The electrolyte was prepared by applying 0.1 g of PEG600 (Wako) in a mortar, adding $SnCl_2 \cdot H_2O$ (0.0226 g), and stirring for 10 minutes. The results are shown in Table 1.

The cell did not generate electricity.

Comparative Example 3

In this comparative example, the procedure described in Example 1 was repeated except for using PEI500 instead of PEI500 as the solid electrolyte, to prepare a thermoelectric cell.

The electrolyte was prepared by applying 0.1 g of PEI500 (Wako) in a mortar, adding CuCl (0.02 g), and stirring for 10 minutes. The results are shown in Table 1.

The cell did not generate electricity.

Example 6

In this example, the procedure described in Example 1 was repeated except for using CuCl and $CuCl_2$ instead of CuCl as the ion source, and LiCl as the additive, to prepare a thermoelectric cell.

Figure 6:
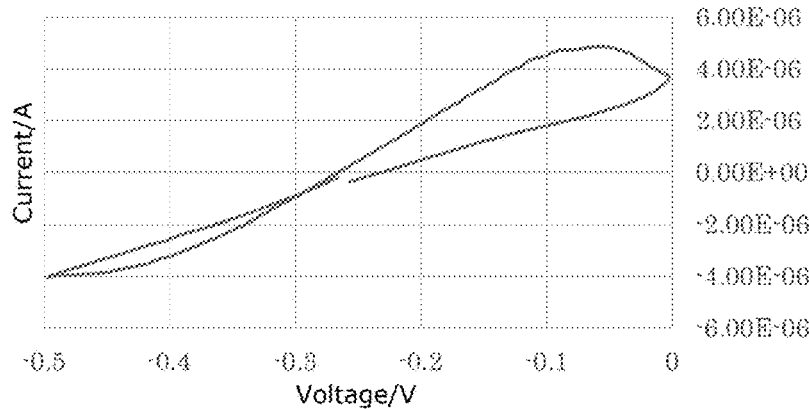
FIG. 6 is graphs showing a CV measurement (a) and a discharge measurement (b) at 80° C., a CV measurement (c) at 35° C., and a discharge measurement (d) after leaving at room temperature, of the thermoelectric cell obtained in Example 6.
Figure 6:
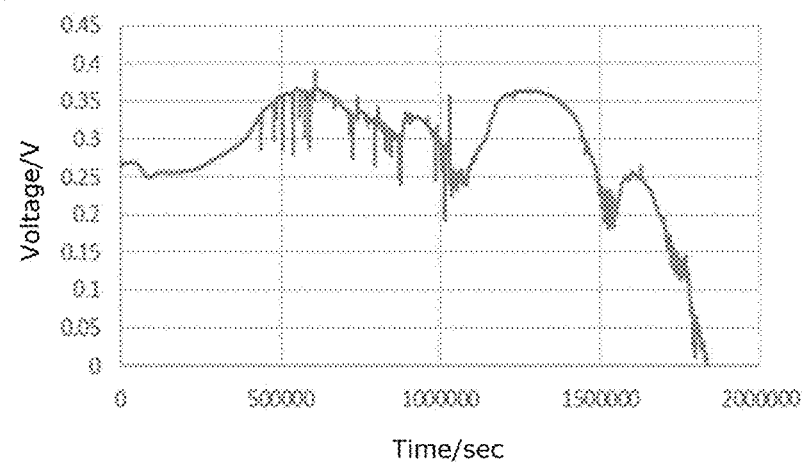
Figure 6:
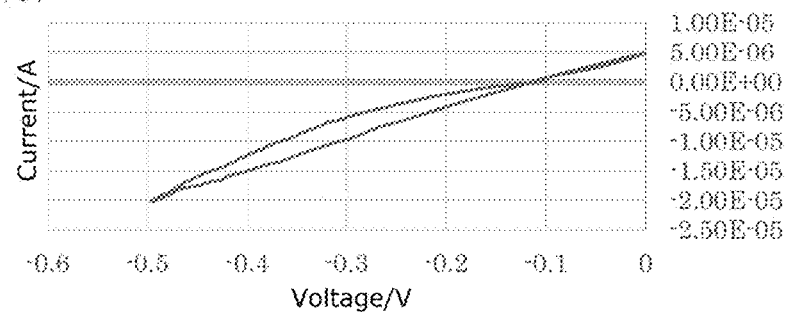
Figure 6:
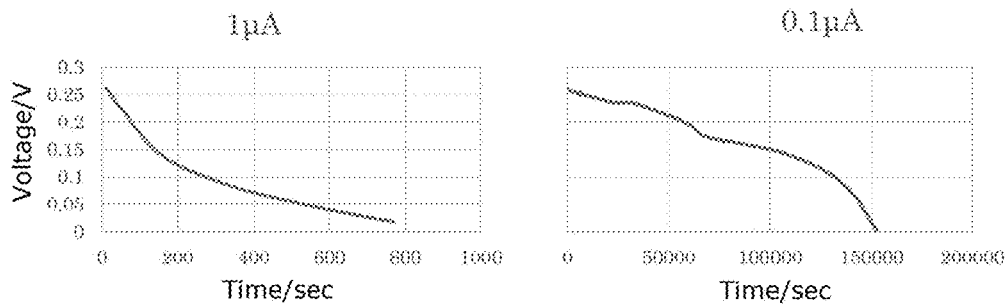

The electrolyte was prepared by applying 0.1 g of PEG600 (Wako) in a mortar, adding CuCl (0.01 g) and $CuCl_2$ (0.014 g), and adding LiCl (0.005 g) as the additive, and then stirring for 10 minutes. The results are shown in Table 1 and FIG. 6.

Power generation characteristics with an open circuit voltage of about 0.25 V and a short-circuit current of about 4 microamperes were observed (FIG. 6a). A discharge at 10 nanoamperes was observed for 505 hours (FIG. 6b).

Further, at 35° C., an electric generation with an open circuit voltage of about 0.1 V and a short-circuit current of about 5 microamperes were observed (FIG. 6c). A discharge at 100 nanoamperes was observed for 2.5 hours.

Furthermore, after the cell was discharged (1 μA), it was left at room temperature for 12 hours, and then the discharge characteristics (100 nA) were observed again. That is, it was found that the discharge characteristics were restored by the thermal energy at room temperature (FIG. 6d)

Accordingly, it was found that the above cell configuration generate stable electricity and the discharge characteristics were restored by the energy at room temperature.

Example 7

In this example, the procedure described in Example 6 was repeated except for using PEG100000 with a molecular weight of 100,000 instead of PEG600 as the solid electrolyte, to prepare a thermoelectric cell.

The electrolyte was prepared by applying 0.5 g of PEG100000 (Wako) in a mortar, adding CuCl (0.05 g) and $CuCl_2$ (0.07 g), and adding LiCl (0.1 g) as the additive, and then stirring for 10 minutes at room temperature. The electrolyte was prepared by vacuum drying at 60° C. for 2 hours. The results are shown in Table 1 and FIG. 7.

Figure 7:
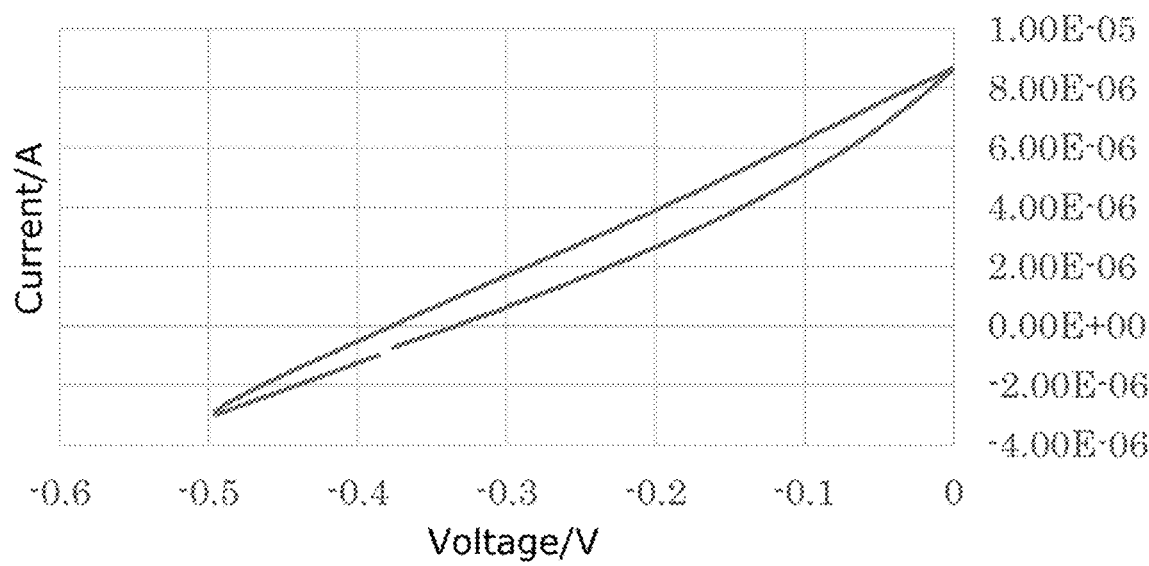
FIG. 7 is graphs showing a CV measurement (a) and a discharge measurement (b) of the thermoelectric cell obtained in Example 7.
Figure 7:
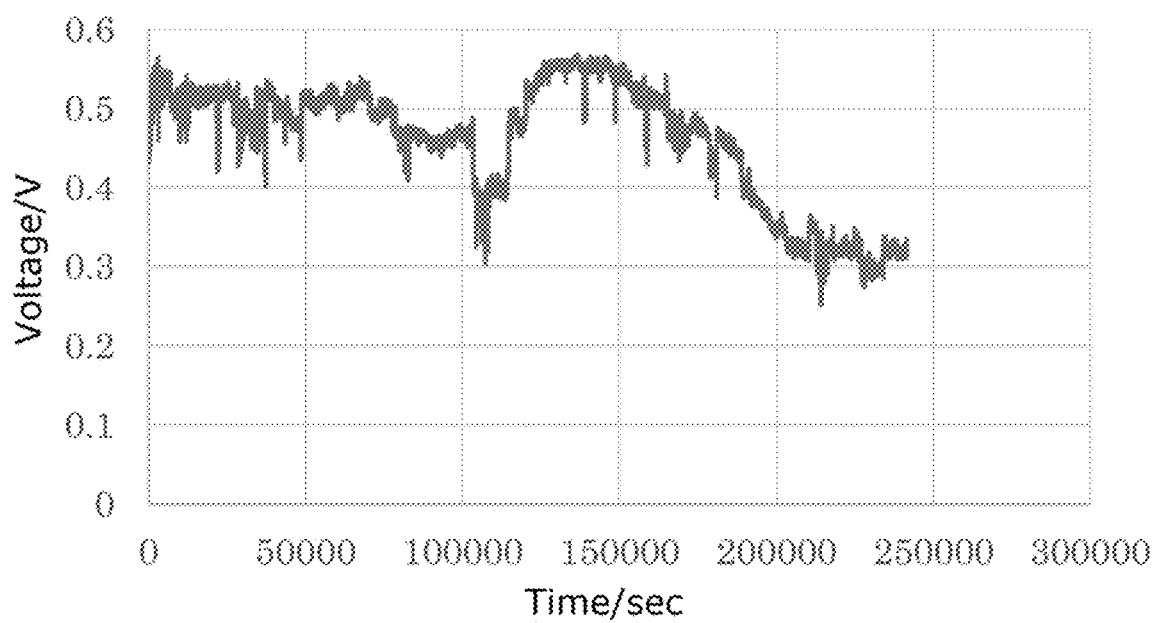

The CV measurement at 80° C. is shown in FIG. 7. An electric generation with an open circuit voltage of 0.35 V and a short-circuit current of 8 microamperes were observed (FIG. 7a). A stable discharge at 10 nanoamperes was continued for 70 hours. (FIG. 7b).

Example 8

In this example, the procedure described in Example 6 was repeated except for further using acetonitrile as the additive, to prepare a thermoelectric cell.

Figure 8:
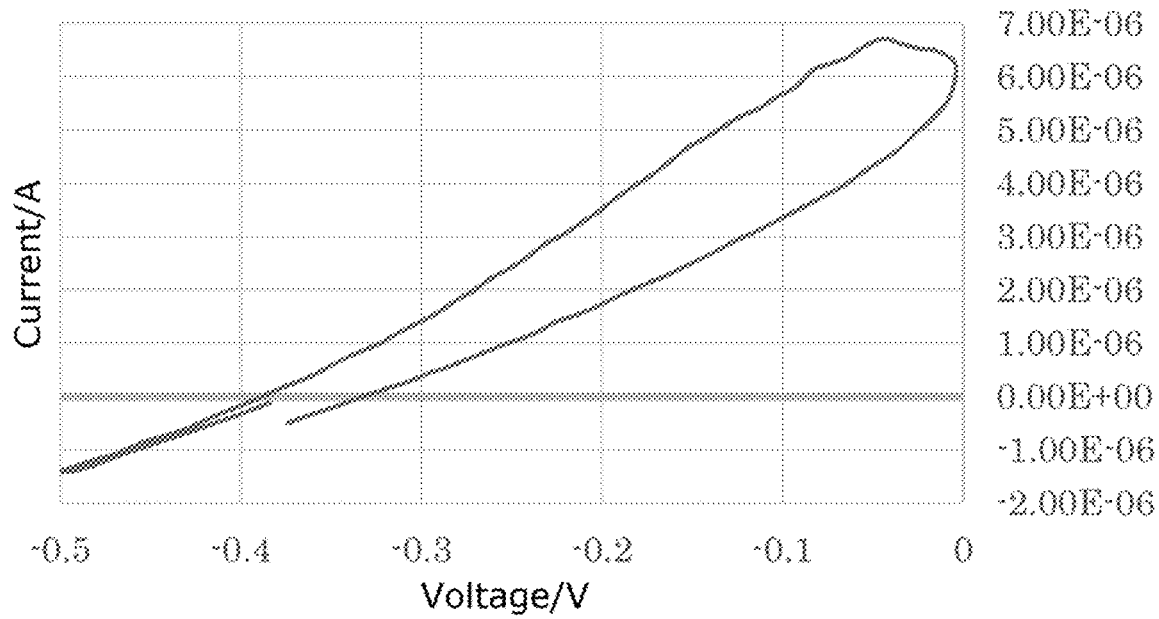
FIG. 8 is graphs showing a CV measurement (a) and a discharge measurement (b) after leaving of the thermoelectric cell obtained in Example 8.
Figure 8:
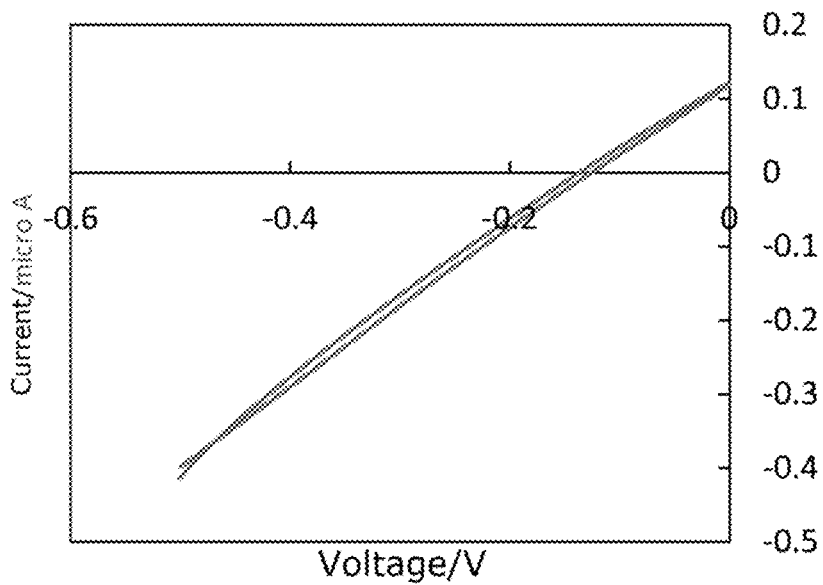

The electrolyte was prepared by applying 0.1 g of PEG600 (Wako) in a mortar, adding CuCl (0.01 g) and $CuCl_2$ (0.014 g), and adding LiCl (0.005 g) and ACN (0.5 mL) as the additive, and then stirring for 10 minutes. The results are shown in Table 1 and FIG. 8.

The CV measurement at 80° C. is shown in FIG. 8a. Power generation characteristics with an open circuit voltage of about 0.35 V and a short-circuit current of about 6 microamperes were observed (FIG. 8a). Next, when this cell was held at 80° C. and the discharge characteristics at 100 nanoamperes were tested, the cell showed an average voltage of about 0.4V and the discharge was completed in about 80 hours. However, after the cell was left at 80° C. for 1 day, an electric generation with an open circuit voltage of 0.5 V and a short-circuit current of 2 microamperes were observed again, and this discharge continued for about 1 day. Furthermore, after the cell was left at 80° C. for 2 days, the discharge characteristics with an open circuit voltage of 0.5V were restored (FIG. 8b), and this discharge continued for about 2 days.

Example 9

In this example, the procedure described in Example 6 was repeated except for using KCl instead of LiCl as the additive, to prepare a thermoelectric cell.

Figure 9:
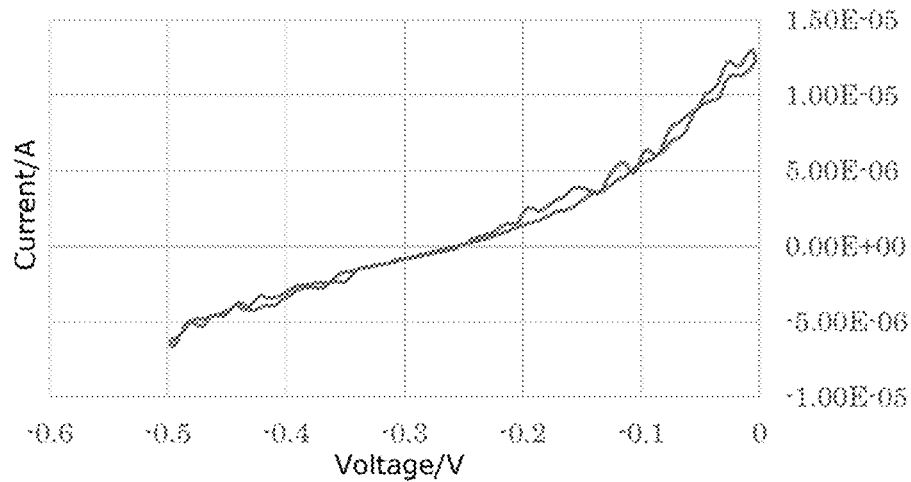
FIG. 9 is graphs showing a CV measurement (a) and a discharge measurement (b) of the thermoelectric cell obtained in Example 9.
Figure 9:
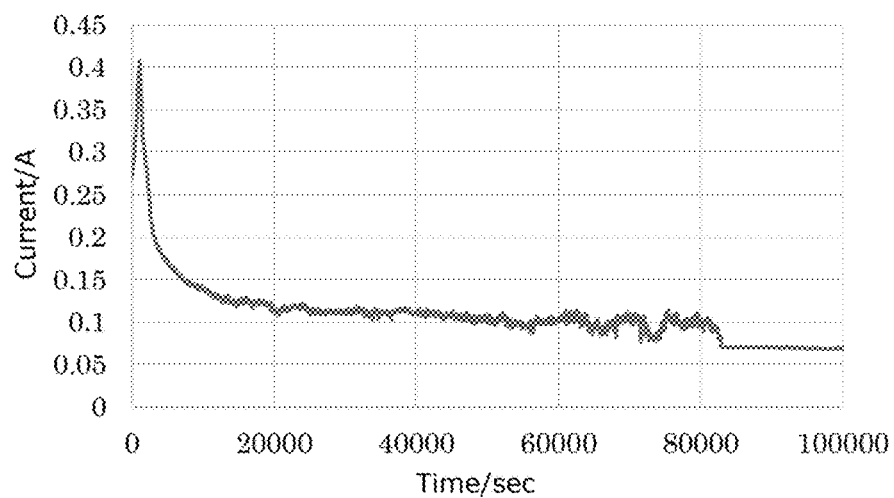

The electrolyte was prepared by applying 0.1 g of PEG600 in a mortar, adding CuCl (0.01 g) and $CuCl_2$ (0.014 g), and adding KCl (0.034 g) and ACN (0.25 mL) as the additive, and ethanol (0.25 mL) and then stirring for 10 minutes at room temperature. The electrolyte was prepared by vacuum drying at 60° C. for 4 hours. The results are shown in Table 1 and FIG. 9.

Power generation characteristics with an open circuit voltage of 0.25V and a short-circuit current of about 10 microamperes were observed (FIG. 9a), and this discharge at 10 nanoamperes continued for about 120 hours (FIG. 9b).

TABLE 1

| | Working electrode | Electrolyte | Ion source | Additive | Open circuit voltage at 80° C. | Short-circuit current at 80° C. | Discharge duration | Recovery of power generation characteristics |
|---|---|---|---|---|---|---|---|---|
| Example 1 | n-Si/Cr/Ge | PEG600 | CuCl | — | 0.2 V | 4 µA | 2 hours | |
| Example 2 | n-Si/Cr/Ge | PEG600 | CuCl | ACN | 0.2 V | 5 µA | 4 hours | |
| Example 3 | n-Si/Cr/Ge | PEG2000 | CaCl | ACN | 0.2 V | 7 µA | 4.5 hours | |
| Example 4 | n-Si/Cr/Ge | PEG600, PEDE500 | CuCl | ACN | 0.2 V | 1.3 µA | 6 hours | |
| Example 5 | n-Si/Cr/Ge | PEG600 | $FeCl_3$ | — | 0.4 V | 5 µA | 4 hours | |
| Comparative Example 1 | Ge | PEG600 | Ferrocene | — | 0.5 V | 0.1 µA | 40 minutes | |
| Comparative Example 2 | n-Si/Cr/Ge | PEG600 | $SnCl_2 \cdot H_2O$ | — | — | — | — | |
| Comparative Example 3 | n-Si/Cr/Ge | PEI500 | CuCl | — | — | — | — | |
| Example 6 | n-Si/Cr/Ge | PEG600 | CuCl, $CuCl_2$ | LiCl | 0.25 V | 4 µA | 505 hours | ○ |
| Example 7 | n-Si/Cr/Ge | PEG100000 | CuCl, $CuCl_2$ | LiCl | 0.35 V | 8 µA | 70 hours | |
| Example 8 | n-Si/Cr/Ge | PEG600 | CuCl, $CuCl_2$ | LiCl, ACN | 0.35 V | 6 µA | 80 hours | ○ |
| Example 9 | n-Si/Cr/Ge | PEG600 | CuCl, $CuCl_2$ | KCl | 0.25 V | 10 µA | 120 hours | |

Example 10

In this example, a thermoelectric cell was prepared using PVDF1000000 as the solid electrolyte, and CuCl and $CuCl_2$ as the ion source.

The following working electrode was used. 20 nanometers of Cr was deposited as a binder on n-Si having a thickness of about 0.5 mm, and 2 µm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 10:
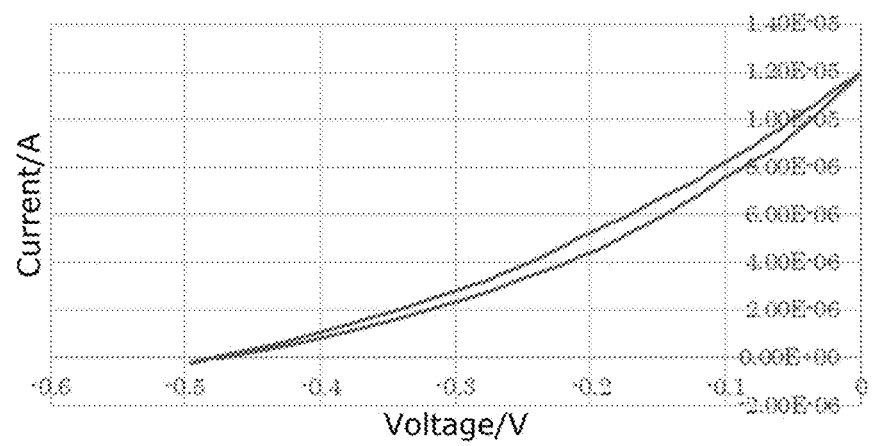
FIG. 10 is a graph showing a CV measurement of the thermoelectric cell obtained in Example 10.

The electrolyte was prepared by applying PVDF (0.1 g), CuCl (0.02 g), and LiCl (0.03 g) in a mortar, adding NMP (2 mL), and then mixing and stirring while heating to 60° C. After completely dissolved $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning. Power generation characteristics with an open circuit voltage of about 0.48 V and a short-circuit current of 12 µA were observed at 80° C. (FIG. 10 and Table 2).

Example 11

In this example, a thermoelectric cell was prepared using PPC40000 as the solid electrolyte, and CuCl and $CuCl_2$ as the ion source.

The following working electrode was used. 20 nanometers of Cr was deposited as a binder on n-Si having a thickness of about 0.5 mm, and 2 µm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 11:
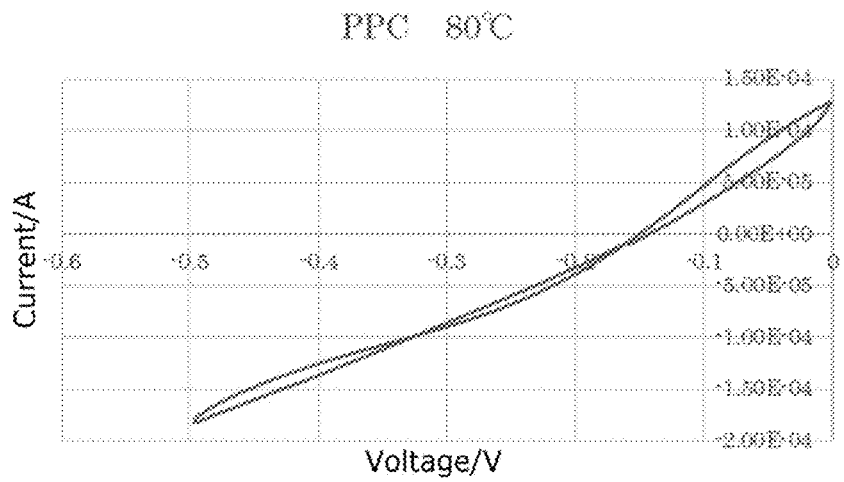
FIG. 11 is graphs showing a CV measurement (a) and a discharge measurement (b) of the thermoelectric cell obtained in Example 11.
Figure 11:
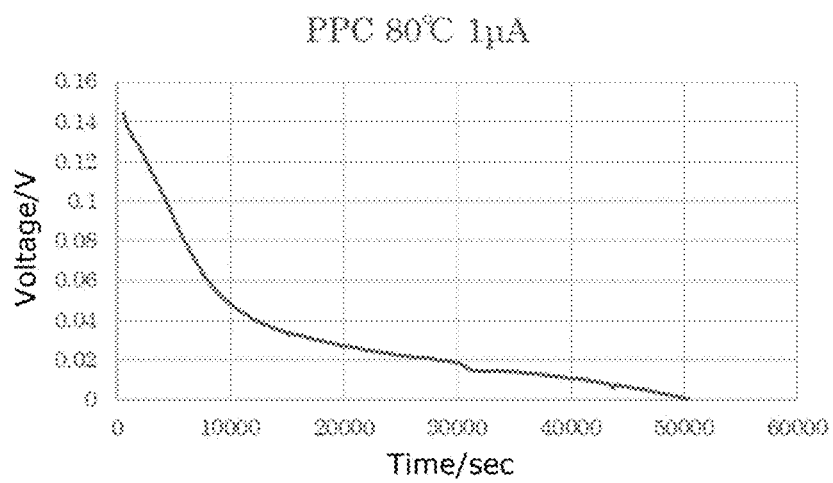

The electrolyte was prepared by applying PPC (0.1 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning. Power generation characteristics with an open circuit voltage of about 0.15 V and a short-circuit current of 120 µA were observed at 80° C. A discharge at 1 µA continued for 14 hours or more. (FIG. 11 and Table 2)

Example 12

In this example, a thermoelectric cell was prepared using PPG2000 as the solid electrolyte, and CuCl and $CuCl_2$ as the ion source.

The following working electrode was used. 20 nanometers of Cr was deposited as a binder on n-Si having a thickness of about 0.5 mm, and 2 µm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 12:
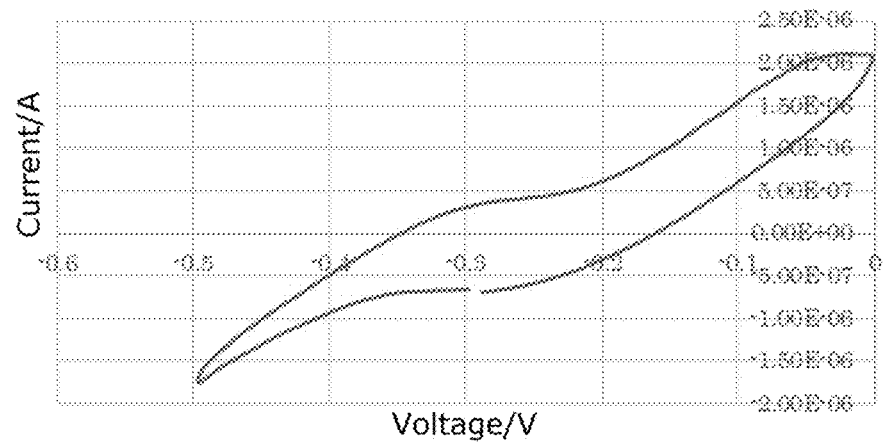
FIG. 12 is a graph showing a CV measurement of the thermoelectric cell obtained in Example 12.

The electrolyte was prepared by applying PPG (0.1 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning. Power generation characteristics with an open circuit voltage of about 0.18 V and a short-circuit current of 2.1 µA were observed at 80° C. (FIG. 12 and Table 2).

Example 13

In this example, a thermoelectric cell was prepared using PPG2000/PVDF1000000 as the solid electrolyte, and CuCl and $CuCl_2$ as the ion source.

The following working electrode was used. 20 nanometers of Cr was deposited as a binder on n-Si having a thickness of about 0.5 mm, and 2 µm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 13:
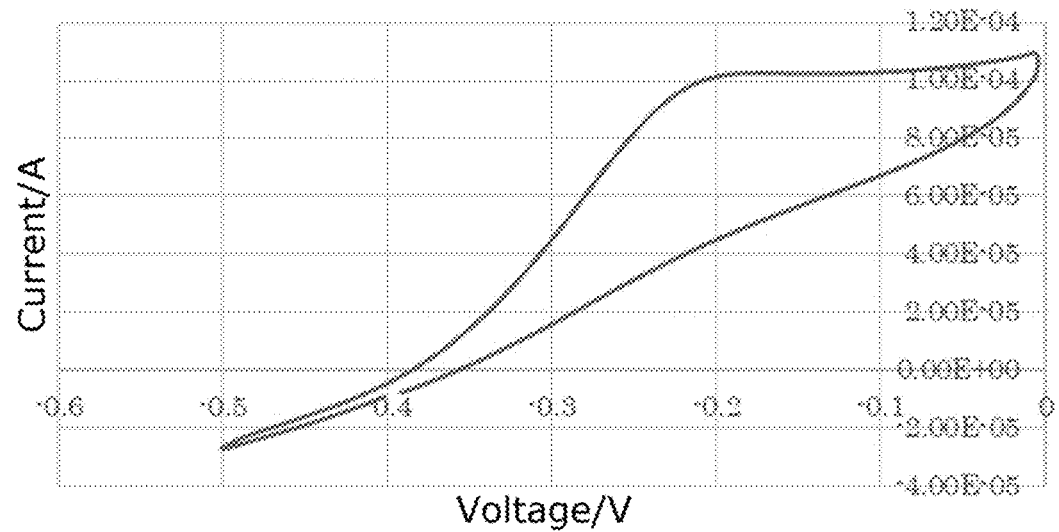
FIG. 13 is a graph showing a CV measurement of the thermoelectric cell obtained in Example 13.

The electrolyte was prepared by applying PPG (0.05 g), PVDF (0.05 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning. Power generation characteristics with an open circuit voltage of about 0.35 V and a short-circuit current of 110 μA were observed at 80° C. (FIG. 13 and Table 2).

Example 14

In this example, a thermoelectric cell was prepared using PEG100000/PVDF1000000 as the solid electrolyte, and CuCl and $CuCl_2$ as the ion source.

The following working electrode was used. 20 nanometers of Cr was deposited as a binder on n-Si having a thickness of about 0.5 mm, and 2 μm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

The electrolyte was prepared by applying PEG (0.05 g), PVDF (0.05 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning.

Figure 14:
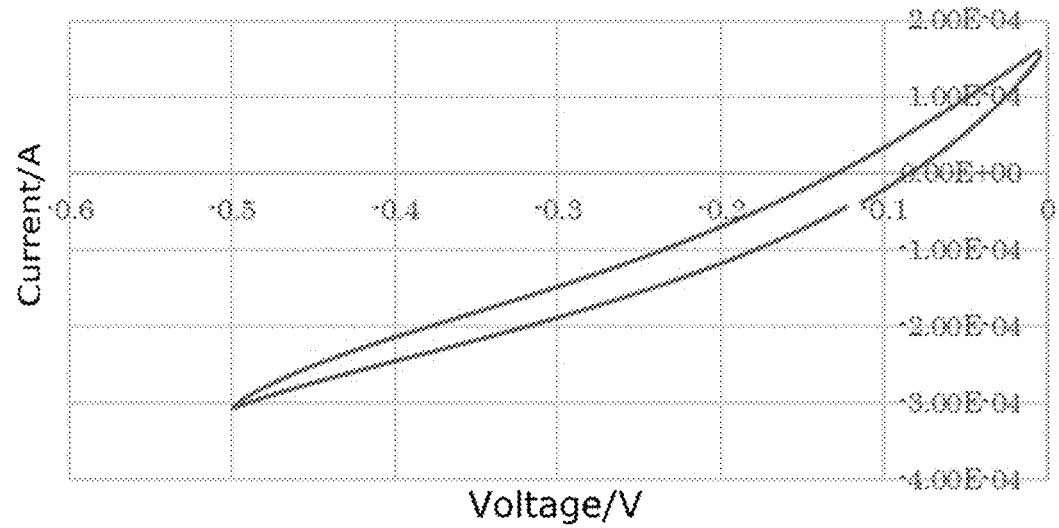
FIG. 14 is a graph showing a CV measurement of the thermoelectric cell obtained in Example 14.

Power generation characteristics with an open circuit voltage of about 0.1 V and a short-circuit current of 150 μA were observed at 80° C. (FIG. 14 and Table 2).

Example 15

In this example, a thermoelectric cell was prepared using PPC40000/PVDF1000000 as the solid electrolyte, and CuCl and $CuCl_2$ as the ion source.

The following working electrode was used. 20 nanometers of Cr was deposited as a binder on n-Si having a thickness of about 0.5 mm, and 2 μm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 15:
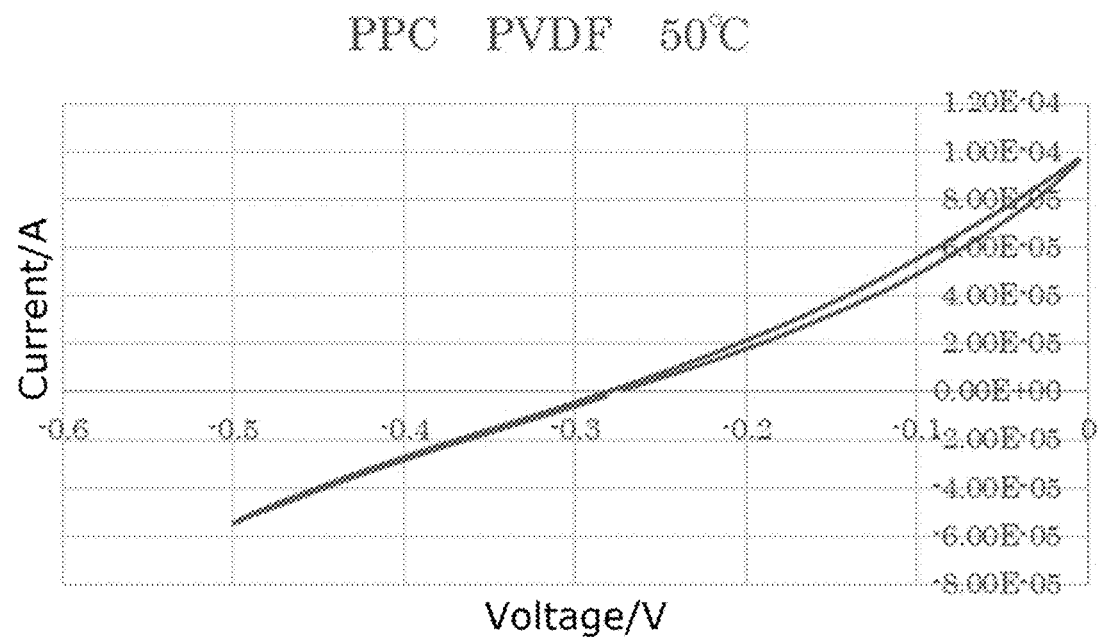
FIG. 15 is graphs showing a CV measurement (a) and a discharge measurement (b) of the thermoelectric cell obtained in Example 15.
Figure 15:
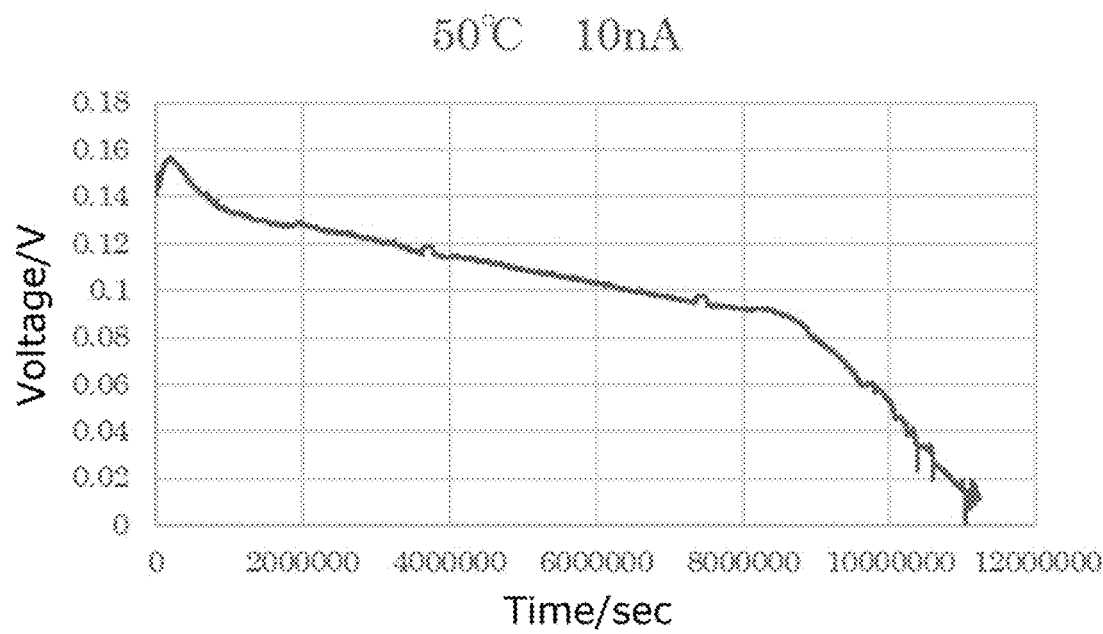

The electrolyte was prepared by applying PPC (0.05 g), PVDF (0.05 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning. Power generation characteristics with an open circuit voltage of about 0.28V and a short-circuit current of 100 μA were observed at 50° C. A discharge at 10 nA continued for 3119 hours or more (FIG. 15 and Table 2).

Example 16

In this example, a thermoelectric cell was prepared using PPC40000/PVDF1000000 as the solid electrolyte, and CuCl and $CuCl_2$ as the ion source.

The following working electrode was used. 20 nanometers of Cr was deposited as a binder on n-Si having a thickness of about 0.5 mm, and 2 μm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 16:
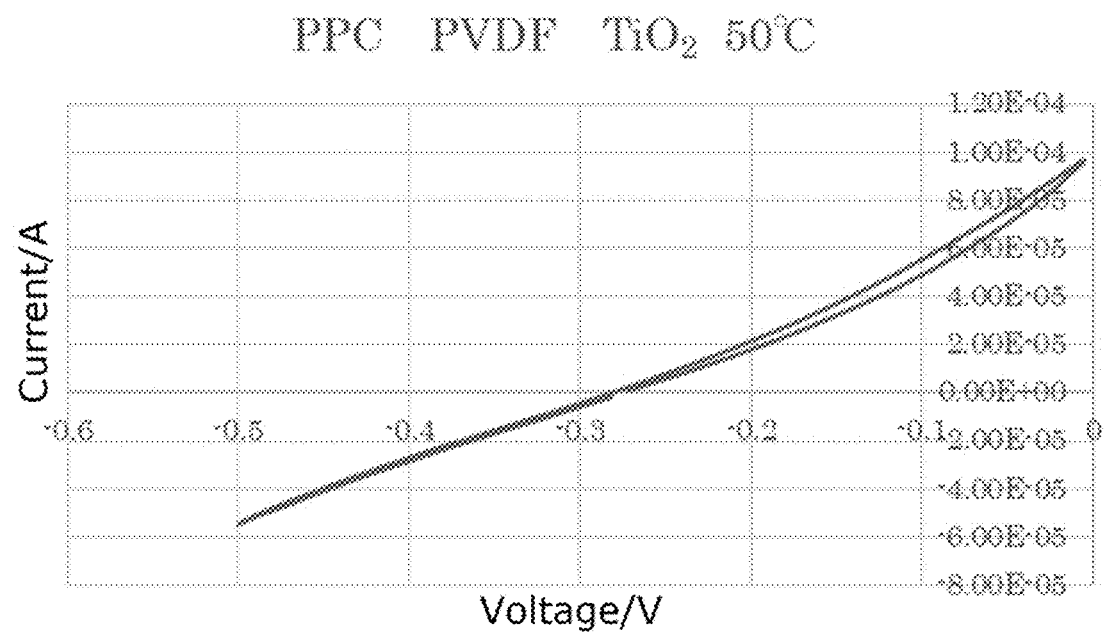
FIG. 16 is graphs showing a CV measurement (a) and a discharge measurement (b) of the thermoelectric cell obtained in Example 16.
Figure 16:
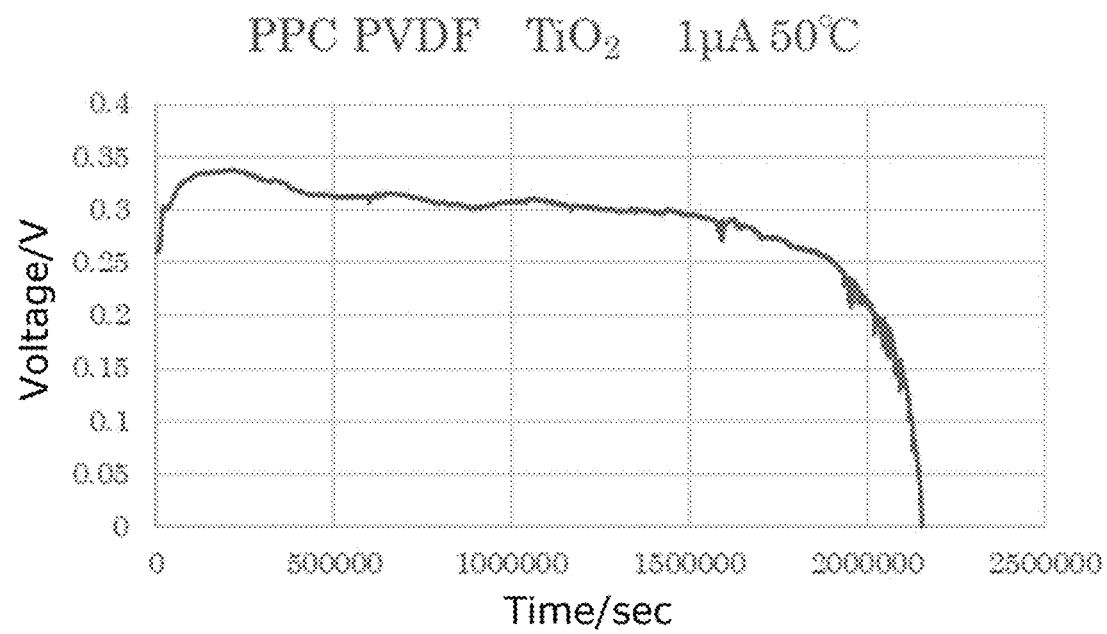

The electrolyte was prepared by applying PPC (0.05 g), PVDF (0.05 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. Finally, $TiO_2$ powder was added thereto and stirred. The resulting gel was applied to a PE membrane and it was vacuum dried. A sample cell was assembled using a case of button cell type 2035 in a glove box. The resulting cell was placed in a constant-temperature bath. CV measurement was performed at a scan rate of 10 mV/sec by potential scanning. Power generation characteristics with an open circuit voltage of about 0.28V and a short-circuit current of 100 μA were observed at 50° C. A discharge at 1 μA continued for 595 hours or more (FIG. 16 and Table 2).

Example 17

In this example, a thermoelectric cell was prepared using PEC250000/PVA5000 as the solid electrolyte, and CuCl and $CuCl_2$ as the ion source.

The following working electrode was used. 20 nanometers of Cr was deposited as a binder on n-Si having a thickness of about 0.5 mm, and 2 μm of Ge was deposited thereon, and it was cut into a disk with a diameter of 1 cm.

As the counter electrode, a SUS spacer with a diameter of 1 cm and a thickness of 0.5 mm, which was coated with PEDOT/PSS, was used.

Figure 17:
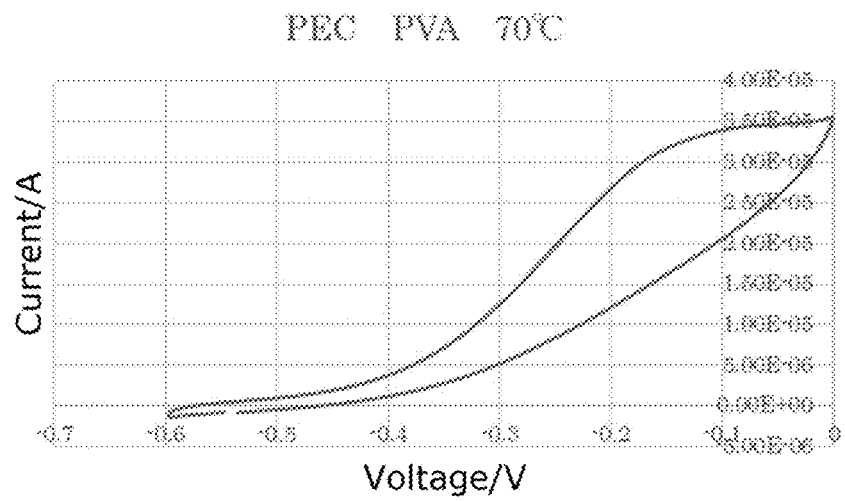
FIG. 17 is graphs showing a CV measurement (a) and a discharge measurement (b) at 70° C., and a discharge measurement (b) at 50° C., of the thermoelectric cell obtained in Example 17.
Figure 17:
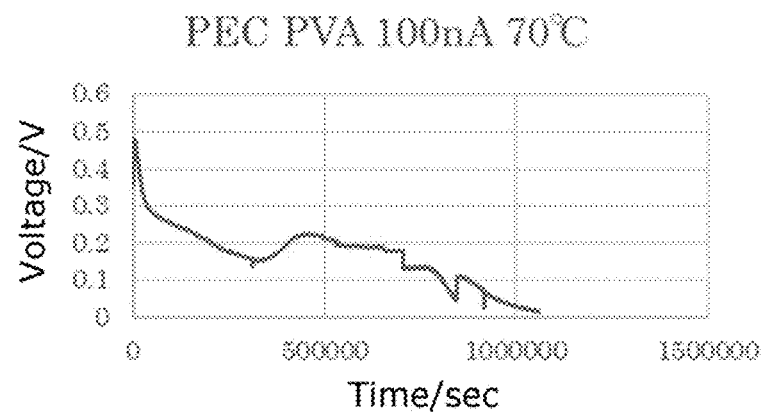
Figure 17:
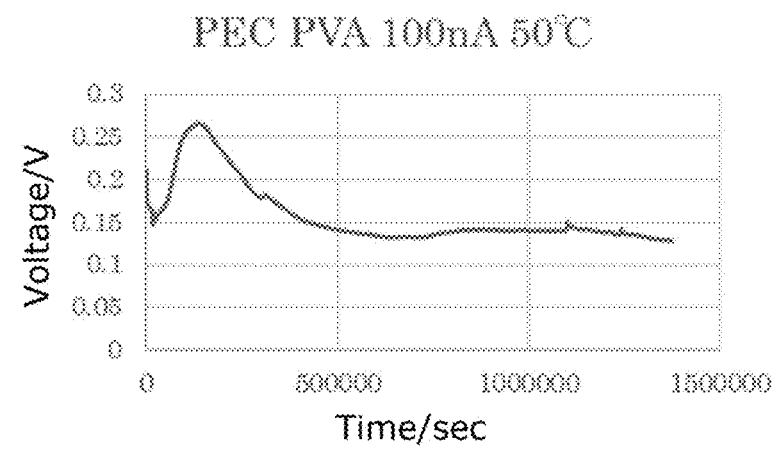

The electrolyte was prepared by applying PEC (0.05 g), PVA (0.05 g), CuCl (0.02 g), and LiCl (0.03 g) in a mortar, adding NMP (2 mL), and then mixing and stirring while heating to 60° C. After completely dissolved, $CuCl_2$ (0.028 g) was added thereto, and all of them was mixed and stirred. The resulting gel was applied to a PE membrane and it was vacuum dried. A sample cell was assembled using a case of button cell type 2032 in a glove box. The resulting cell was placed in a constant-temperature bath. CV measurement was performed at a scan rate of 10 mV/sec by potential scanning. Power generation characteristics with an open circuit voltage of about 0.45V and a short-circuit current of 35 μA were observed at 70° C. A discharge at 100 nA continued for 294 hours or more (FIG. 17 and Table 2).

Further, the resulting cell was placed in a constant-temperature bath (50° C.). CV measurement was performed at a scan rate of 10 mV/sec by potential scanning. A discharge at 100 nA continued for 381 hours or more at 50° C. (FIG. 17 and Table 2).

TABLE 2

|  | Working electrode | Electrolyte | Ion source | Additive | Power generation temperature | Open circuit voltage | Short-circuit current | Discharge current | Duration |
|---|---|---|---|---|---|---|---|---|---|
| Example 10 | n-Si/Cr/Ge | PVDF | $CuCl_2$, CuCl | LiCl | 80° C. | 0.48 V | 12 μA | — | — |
| Example 11 | n-Si/Cr/Ge | PPC | $CuCl_2$, CuCl | LiCl | 80° C. | 0.15 V | 120 μA | 1 μA | 14 hours |
| Example 12 | n-Si/Cr/Ge | PPG | $CuCl_2$, CuCl | LiCl | 80° C. | 0.18 V | 201 μA | — | — |
| Example 13 | n-Si/Cr/Ge | PPG/PVDF | $CuCl_2$, CuCl | LiCl | 80° C. | 0.35 V | 110 μA | — | — |
| Example 14 | n-Si/Cr/Ge | PEG/PVDF | $CuCl_2$, CuCl | LiCl | 80° C. | 0.1 V | 150 μA | — | — |
| Example 15 | n-Si/Cr/Ge | PPC/PVDF | $CuCl_2$, CuCl | LiCl | 50° C. | 0.28 V | 100 μA | 10 μA | 3119 hours |
| Example 16 | n-Si/Cr/Ge | PPC/PVDF/$TiO_2$ | $CuCl_2$, CuCl | LiCl | 50° C. | 0.28 V | 100 μA | 1 μA | 595 hours |
| Example 17 | n-Si/Cr/Ge | PEC/PVA | $CuCl_2$, CuCl | LiCl | 70° C. | 0.45 V | 35 μA | 100 μA | 294 hours |

INDUSTRIAL APPLICABILITY

The thermoelectric battery and the method for generating thermoelectricity using the same of the present invention can be used in a small portable power generation device, a geothermal power generation, a thermoelectric generation using exhaust heat of an automobile, and a heat-utilizing electric generation using waste heat (exhaust heat) of a substation, a steel furnace, a factory, or a waste incineration plant.

The invention claimed is:

1. A thermoelectric battery comprising a working electrode containing a n-type silicon and germanium, a counter electrode, and a solid electrolyte having a polymer comprising a repeating unit represented by the following formula (1) or a derivative thereof:

[Chemical formula 1]

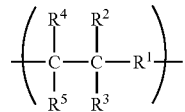

(1)

wherein $R^1$ is a single bond, an oxygen atom, a sulfur atom, —NH—, —$PH_3$—, —(P=O)$R^6$—, —O—(P=O)H—O—, a carbonate group (—O—(C=O)—O—), a carbonyl group, a sulfonyl group, an ester group, or an arylene dioxy group (—O—Ar—O—),
$R^2$, $R^3$, $R^4$, and $R^5$ are independently a hydrogen atom, a fluorine atom, an alkyl group having 1 to 3 carbon atoms, a hydroxyl group, a cyano group, an amino group, a carboxyl group, a phosphoryl group, an aldehyde group, a methylcarbonyl group, a methylsulfonyl group, a sulfanyl group (—SH), a nitro group, a phenoxy group, a methyl ester group, a trifluoromethyl group, and
$R^6$ is an alkylene group having 1 to 3 carbon atoms,
wherein the repeating unit may be the same, or combinations of two or more repeating units,
wherein a molecular weight of the polymer or the derivative is 200 to 1,000,000, and the solid electrolyte contains copper ions or iron ions as an ion source.

2. The thermoelectric battery according to claim 1, wherein the solid electrolyte comprises alkali metal ions.

3. The thermoelectric battery according to claim 2, wherein the alkali metal ions are comprised therein as LiCl or KCl.

4. The thermoelectric battery according to claim 1, wherein the copper ions are monovalent and divalent copper ions.

5. The thermoelectric battery according to claim 1, wherein the n-type silicon and germanium are laminated via chromium in the working electrode.

6. The thermoelectric battery according to claim 1, wherein the solid electrolyte further comprises an inorganic oxide.

7. The thermoelectric battery according to claim 1, wherein the polymer is selected from the group consisting of polyvinylidene fluoride, polyvinyl alcohol, polyethylene glycol, polypropylene glycol, polyethylene carbonate, and polypropylene carbonate, or a derivative thereof.

8. A process for generating thermoelectricity, comprising heating the thermoelectric battery according to claim 1, to 25° C. or more to generate electricity.

9. The process for generating thermoelectricity according to claim 8, further comprising:
leaving the thermoelectric battery in an insulated state after heating and generating electricity, and
the additional step of heating the thermoelectric battery to 25° C. or more to generate electricity.

\* \* \* \* \*